(12) United States Patent
Kim

(10) Patent No.: US 10,803,915 B1
(45) Date of Patent: Oct. 13, 2020

(54) SEMICONDUCTOR DEVICES

(71) Applicant: SK hynix Inc., Icheon-si, Gyeonggi-do (KR)

(72) Inventor: Woongrae Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/721,348

(22) Filed: Dec. 19, 2019

(30) Foreign Application Priority Data

Sep. 6, 2019 (KR) ........................ 10-2019-0111074

(51) Int. Cl.
*G11C 7/22* (2006.01)
*G11C 7/10* (2006.01)
*G11C 11/4096* (2006.01)
*G11C 11/4076* (2006.01)

(52) U.S. Cl.
CPC ............ *G11C 7/222* (2013.01); *G11C 7/1036* (2013.01); *G11C 11/4076* (2013.01); *G11C 11/4096* (2013.01); *G11C 2207/2272* (2013.01)

(58) Field of Classification Search
None
See application file for complete search history.

(56) References Cited

U.S. PATENT DOCUMENTS

| 8,351,282 | B2 * | 1/2013 | Lee ...................... G11C 7/1093 365/193 |
| 2008/0002484 | A1 * | 1/2008 | Cho ........................ G11C 8/18 365/189.12 |
| 2019/0027199 | A1 | 1/2019 | Lee et al. |
| 2019/0348094 | A1 * | 11/2019 | Park ..................... G11C 7/1093 |
| 2020/0105334 | A1 * | 4/2020 | Kim .................... G11C 11/4082 |
| 2020/0160896 | A1 * | 5/2020 | Kwak ...................... G11C 7/22 |
| 2020/0176035 | A1 * | 6/2020 | Kim ....................... G11C 7/109 |

FOREIGN PATENT DOCUMENTS

KR 100682429 B1 2/2007

* cited by examiner

*Primary Examiner* — Tan T. Nguyen
(74) *Attorney, Agent, or Firm* — William Park & Associates Ltd.

(57) ABSTRACT

A semiconductor device includes a pre-shift circuit and a shift circuit. The pre-shift circuit shifts an internal write signal by a pre-shift period to generate a pre-write signal. The shift circuit shifts the pre-write signal by a shift period to generate a shift write signal for generating a column selection signal. The column selection signal is activated to select a column path through which data are inputted or outputted. The pre-shift period is set as a period corresponding to a multiple of "L" times a cycle of a clock signal, wherein "L" is a natural number which is equal to or greater than two.

20 Claims, 17 Drawing Sheets

FIG.7

| MN | MODD | SCNT |
|---|---|---|
| L | L | L |
| H | L | H |
| L | H | H |
| H | H | L |

FIG.9

| CWL-OFFSET | SC<1> | SC<2> | SC<3> | SC<4> | SC<5> | SC<6> | LS<1> | LS<2> | LS<3> | LS<4> | LS<5> |
|---|---|---|---|---|---|---|---|---|---|---|---|
| 64 | L | H | H | H | H | H | L | L | L | L | H |
| 62 | L | H | H | H | H | H | L | L | L | H | L |
| 60 | L | H | H | H | H | H | L | L | H | L | L |
| 58 | L | H | H | H | H | H | L | H | L | L | L |
| 56 | L | L | H | H | H | H | L | L | L | L | H |
| 54 | L | L | H | H | H | H | L | L | L | H | L |
| 52 | L | L | L | H | H | H | L | L | H | L | L |
| 50 | L | L | L | H | H | H | L | H | L | L | L |
| 48 | L | L | L | H | H | H | L | L | L | L | H |
| 46 | L | L | L | L | H | H | L | L | L | H | L |
| 44 | L | L | L | L | H | H | L | L | H | L | L |
| 42 | L | L | L | L | H | H | L | H | L | L | L |
| 40 | L | L | L | L | L | H | L | L | L | L | H |
| 38 | L | L | L | L | L | H | L | L | L | H | L |
| 36 | L | L | L | L | L | H | L | L | H | L | L |
| 34 | L | L | L | L | L | H | L | H | L | L | L |
| 32 | L | L | L | L | L | H | L | L | L | L | H |
| 30 | L | L | L | L | L | H | L | L | L | H | L |
| 28 | L | L | L | L | L | H | L | L | H | L | L |
| 26 | L | L | L | L | L | H | L | H | L | L | L |
| 24 | L | L | L | L | L | L | L | L | L | L | H |
| 22 | L | L | L | L | L | L | L | L | L | H | L |
| 20 | L | L | L | L | L | L | L | L | H | L | L |
| 18 | L | L | L | L | L | L | L | H | L | L | L |

US 10,803,915 B1

SEMICONDUCTOR DEVICES

CROSS-REFERENCE TO RELATED APPLICATIONS

The present application claims priority under 35 U.S.C § 119(a) to Korean Application No. 10-2019-0111074, filed on Sep. 6, 2019, which is incorporated herein by reference in its entirety.

BACKGROUND

1. Technical Field

Embodiments of the present disclosure relate to semiconductor devices having a write latency.

2. Related Art

Semiconductor devices such as dynamic random access memory (DRAM) devices may perform a write operation with a write latency. The write latency corresponds to a delay time between a time when a write command is applied to the semiconductor device and a time when data are inputted to memory cells of the semiconductor device. The write latency may be expressed as a number of cycles of a clock signal. For example, a write latency is "1" means that data are inputted to memory cells of a semiconductor device after one cycle of a clock signal elapses from a time when the write command is applied to the semiconductor device. A write latency of "3" means that data are inputted to the memory cells of the semiconductor device after three cycles of the clock signal elapse from a time when the write command is applied to the semiconductor device.

SUMMARY

According to an embodiment, a semiconductor device includes a pre-shift circuit and a shift circuit. The pre-shift circuit is configured to shift an internal write signal by a pre-shift period to generate a pre-write signal. The shift circuit is configured to shift the pre-write signal by a shift period to generate a shift write signal for generating a column selection signal. The column selection signal is activated to select a column path through which data are inputted or outputted. The pre-shift period is set as a period corresponding to a multiple of "L" times a cycle of a clock signal, wherein "L" is a natural number which is equal to or greater than two.

According to another embodiment, a semiconductor device includes an internal write signal generation circuit, a pre-shift circuit, and a shift circuit. The internal write signal generation circuit is configured to, based on an input mode signal and an odd mode signal, generate a first internal write signal from a first internal chip selection signal and a first internal control signal and generate a second internal write signal from a second internal chip selection signal and a second internal control signal. The pre-shift circuit is configured to shift the first internal write signal and the second internal write signal by a pre-shift period to generate a first pre-write signal and a second pre-write signal. The shift circuit is configured to shift the first pre-write signal and the second pre-write signal by a shift period to generate a first shift write signal and a second shift write signal for generating a column selection signal.

BRIEF DESCRIPTION OF THE DRAWINGS

FIG. 7 is a table illustrating an operation of the selection control signal generation circuit shown in FIG. 6.

FIG. 9 is a table illustrating an operation of a shift control circuit included in the semiconductor device of FIG. 1.

DETAILED DESCRIPTION OF THE EMBODIMENTS

Various embodiments of the present disclosure are described hereinafter with reference to the accompanying drawings. However, the embodiments described herein are for illustrative purposes only and are not intended to limit the scope of the present disclosure.

Figure 1:
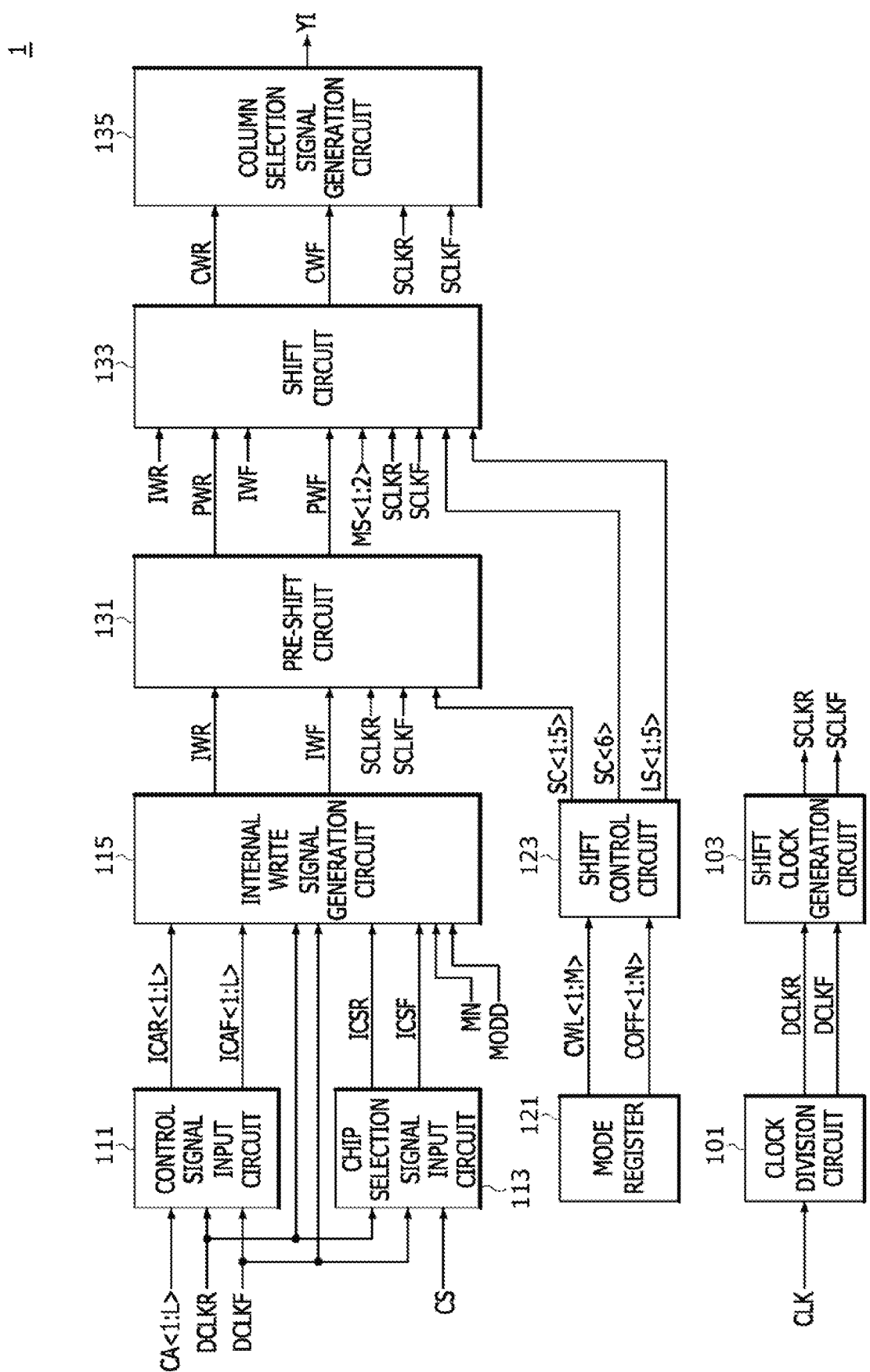
FIG. 1 is a block diagram illustrating a configuration of a semiconductor device according to an embodiment of the present disclosure.

As illustrated in FIG. 1, a semiconductor device 1 according to an embodiment may include a clock division circuit 101, a shift clock generation circuit 103, a control signal input circuit 111, a chip selection signal input circuit 113, an internal write signal generation circuit 115, a mode register 121, a shift control circuit 123, a pre-shift circuit 131, a shift circuit 133, and a column selection signal generation circuit 135.

The clock division circuit 101 may divide a clock signal CLK to generate a first division clock signal DCLKR and a second division clock signal DCLKF. The first division clock signal DCLKR and the second division clock signal DCLKF may be generated as 2-division signals of the clock signal CLK. A cycle of the first division clock signal DCLKR and the second division clock signal DCLKF may be set to be twice a cycle of the clock signal CLK. The second division clock signal DCLKF may correspond to an inverted signal of the first division clock signal DCLKR.

The shift clock generation circuit 103 may generate a first shift clock signal SCLKR and a second shift clock signal SCLKF from the first division clock signal DCLKR and the second division clock signal DCLKF. The shift clock generation circuit 103 may buffer the first division clock signal DCLKR to generate the first shift clock signal SCLKR. The shift clock generation circuit 103 may buffer the second division clock signal DCLKF to generate the second shift clock signal SCLKF. In some embodiments, the shift clock generation circuit 103 may delay the first division clock signal DCLKR to generate the first shift clock signal SCLKR and may delay the second division clock signal DCLKF to generate the second shift clock signal SCLKF.

The control signal input circuit 111 may generate a first internal control signal ICAR<1:L> and a second internal control signal ICAF<1:L> based on a control signal CA<1:L>, the first division clock signal DCLKR, and the second division clock signal DCLKF. The control signal input circuit 111 may be synchronized with a rising edge of the first division clock signal DCLKR to generate the first internal control signal ICAR<1:L> from the control signal CA<1:L>. The control signal input circuit 111 may buffer the control signal CA<1:L> to generate the first internal control signal ICAR<1:L> when a level of the first division clock signal DCLKR is changed from a logic "low" level into a logic "high" level. The control signal input circuit 111 may be synchronized with a rising edge of the second division clock signal DCLKF to generate the second internal control signal ICAF<1:L> from the control signal CA<1:L>. The control signal input circuit 111 may buffer the control signal CA<1:L> to generate the second internal control signal ICAF<1:L> when a level of the second division clock signal DCLKF is changed from a logic "low" level into a logic "high" level. The number "L" of bits included in each of the control signal CA<1:L>, the first internal control signal ICAR<1:L>, and the second internal control signal ICAF<1:L> may be set to be different according to the embodiments.

The chip selection signal input circuit 113 may generate a first internal chip selection signal ICSR and a second internal chip selection signal ICSF based on a chip selection signal CS, the first division clock signal DCLKR, and the second division clock signal DCLKF. The chip selection signal input circuit 113 may be synchronized with a rising edge of the first division clock signal DCLKR to generate the first internal chip selection signal ICSR from the chip selection signal CS. The chip selection signal input circuit 113 may buffer the chip selection signal CS to generate the first internal chip selection signal ICSR when a level of the first division clock signal DCLKR is changed from a logic "low" level into a logic "high" level. The chip selection signal input circuit 113 may be synchronized with a rising edge of the second division clock signal DCLKF to generate the second internal chip selection signal ICSF from the chip selection signal CS. The chip selection signal input circuit 113 may buffer the chip selection signal CS to generate the second internal chip selection signal ICSF when a level of the second division clock signal DCLKF is changed from a logic "low" level into a logic "high" level.

The internal write signal generation circuit 115 may generate a first internal write signal IWR and a second internal write signal IWF based on the first internal control signal ICAR<1:L>, the second internal control signal ICAF<1:L>, the first internal chip selection signal ICSR, the second internal chip selection signal ICSF, an input mode signal MN, an odd mode signal MODD, the first division clock signal DCLKR, and the second division clock signal DCLKF.

Figure 2:
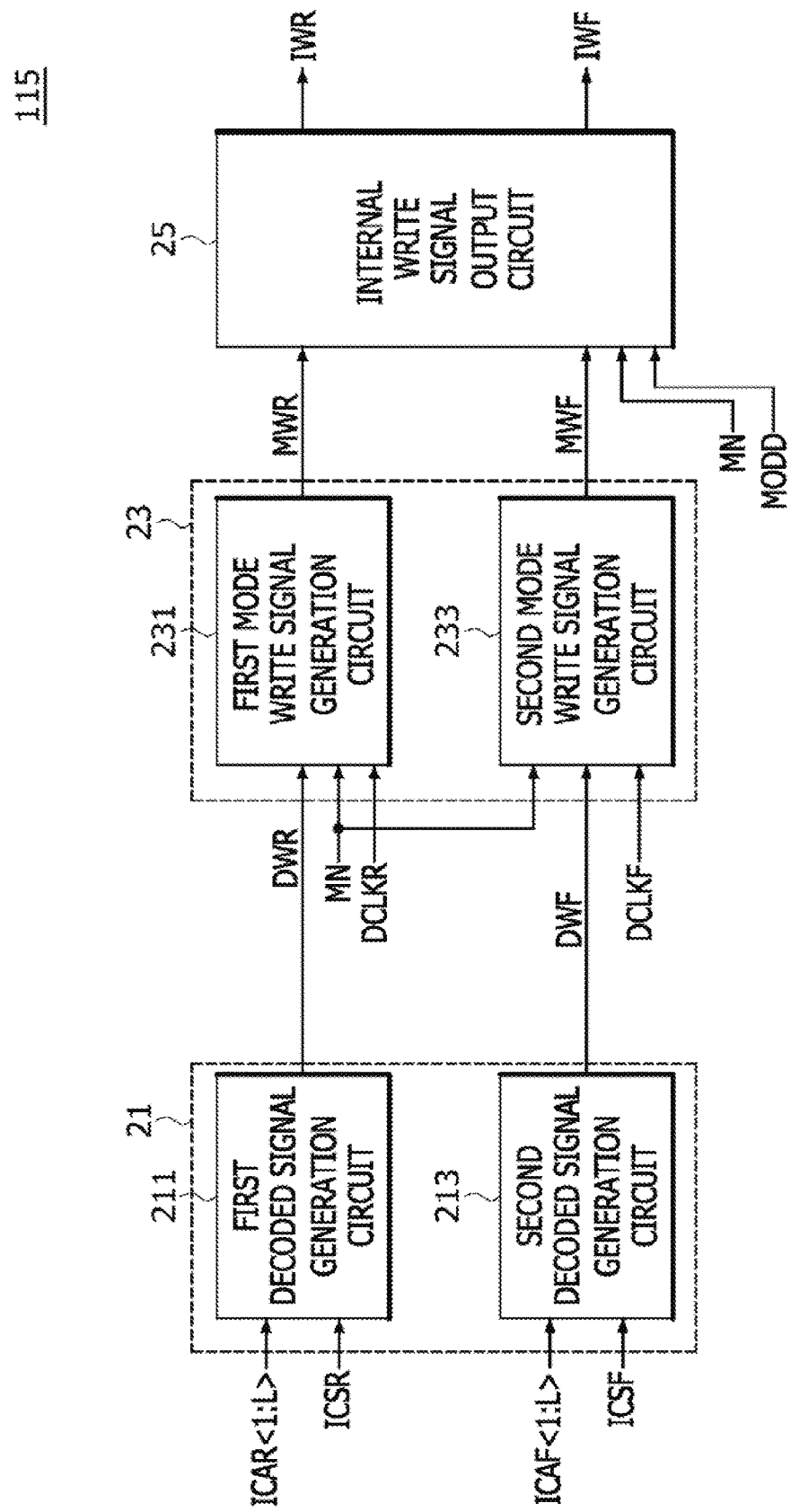
FIG. 2 is a block diagram illustrating a configuration of an internal write signal generation circuit included in the semiconductor device of FIG. 1.

The internal write signal generation circuit 115 may decode the first internal control signal ICAR<1:L> based on the first internal chip selection signal ICSR to generate a first decoded signal (DWR of FIG. 2) and may decode the second internal control signal ICAF<1:L> based on the second internal chip selection signal ICSF to generate a second decoded signal (DWF of FIG. 2). The internal write signal generation circuit 115 may shift the first decoded signal DWR and the second decoded signal DWF based on the input mode signal MN and the first division clock signal DCLKR to generate a first mode write signal (MWR of FIG. 2) and a second mode write signal (MWF of FIG. 2). The input mode signal MN may be set to have a first logic level in a first input mode that a command and an address are inputted through the control signal CA<1:L> for one cycle of the clock signal CLK and may be set to have a second logic level in a second input mode that the command and the address are inputted through the control signal CA<1:L> for two cycles of the clock signal CLK. In the first input mode, the internal write signal generation circuit 115 may shift the first decoded signal DWR and the second decoded signal DWF by a first input period to generate the first mode write signal MWR and the second mode write signal MWF. In the second input mode, the internal write signal generation circuit 115 may shift the first decoded signal DWR and the second decoded signal DWF by a second input period to generate the first mode write signal MWR and the second mode write signal MWF. In the present embodiment, the first logic level of the input mode signal MN may be set as a logic "low" level, and the second logic level of the input mode signal MN may be set as a logic "high" level. In the present embodiment, the first input period may be set as a half cycle (i.e., one cycle of the clock signal CLK) of the first division clock signal DCLKR, and the second input period may be set as one cycle (i.e., two cycles of the clock signal CLK) of the first division clock signal DCLKR.

The internal write signal generation circuit 115 may generate the first internal write signal IWR and the second internal write signal IWF based on the input mode signal MN, the odd mode signal MODD, the first mode write signal MWR, and the second mode write signal MWF. The odd mode signal MODD may be set to have a first logic level at a state that a write latency is set to be an even number and may be set to have a second logic level at a state that the write latency is set to be an odd number. In the present embodiment, the first logic level of the odd mode signal MODD may be set as a logic "low" level, and the second logic level of the odd mode signal MODD may be set as a logic "high" level. The internal write signal generation circuit 115 may selectively output the first mode write signal MWR or the second mode write signal MWF as the first internal write signal IWR or the second internal write signal IWF according to a logic level combination of the input mode signal MN and the odd mode signal MODD. A configuration and an operation of the internal write signal generation circuit 115 will be described more fully with reference to FIGS. 2 to 8.

The mode register 121 may store or output first to $M^{th}$ write latency codes CWL<1:M> and first to $N^{th}$ offset codes COFF<1:N> by a mode register set operation. The first to $M^{th}$ write latency codes CWL<1:M> may have a logic level combination corresponding to the write latency. The first to $N^{th}$ offset codes COFF<1:N> may be set through a write leveling operation to have a logic level combination corresponding to a compensation value for compensating for the write latency. The write leveling operation may be performed to remove a skew between the clock signal CLK and a data strobe signal. The number "M" of bits included in the first to $M^{th}$ write latency codes CWL<1:M> may be set to be different according to the embodiments. In addition, the number "N" of bits included in the first to $N^{th}$ offset codes COFF<1:N> may also be set to be different according to the embodiments.

The shift control circuit 123 may generate first to sixth shift control signals SC<1:6> and first to fifth latch selection signals LS<1:5> based on the first to $M^{th}$ write latency codes CWL<1:M> and the first to $N^{th}$ offset codes COFF<1:N>. The shift control circuit 123 may generate the first to sixth shift control signals SC<1:6> and the first to fifth latch selection signals LS<1:5> according to a compensation latency. The compensation latency may be generated by subtracting a compensation value set by the first to $N^{th}$ offset codes COFF<1:N> from the write latency set by the first to $M^{th}$ write latency codes CWL<1:M>. The first to sixth shift control signals SC<1:6> may be set to have a logic level combination corresponding to a quotient generated when the compensation latency is divided by eight, and the first to fifth latch selection signals LS<1:5> may be set to have a logic level combination corresponding to a remainder generated when the compensation latency is divided by eight. The number of bits included in the shift control signal may be set to be different according to the embodiments, and the number of bits included in the latch selection signal may also be set to be different according to the embodiments. The shift control signal and the latch selection signal may be set as respective ones of a quotient and a remainder generated when the compensation latency is divided by one of various natural numbers. The first to sixth shift control signals SC<1:6> and the first to fifth latch selection signals LS<1:5> generated by the shift control circuit 123 will be described in detail with reference to FIG. 9.

The pre-shift circuit 131 may generate a first pre-write signal PWR and a second pre-write signal PWF from the first internal write signal IWR and the second internal write signal IWF based on the first to fifth shift control signals SC<1:5>, the first shift clock signal SCLKR, and the second shift clock signal SCLKF. The pre-shift circuit 131 may shift the first internal write signal IWR and the second internal write signal IWF by a pre-shift period, which is set by the first to fifth shift control signals SC<1:5>, to generate the first pre-write signal PWR and the second pre-write signal PWF. The pre-shift period may be set in units of "8×K" times a cycle of the clock signal CLK. The number "K" may be set as a natural number corresponding to a logic level combination of the first to fifth shift control signals SC<1:5>. The pre-shift period may be set as a period corresponding to a multiple of a cycle of the clock signal CLK according to the embodiments. A configuration and an operation of the pre-shift circuit 131 will be described in more detail with reference to FIGS. 10 and 11.

The shift circuit 133 may generate a first shift write signal CWR and a second shift write signal CWF from the first pre-write signal PWR, the first internal write signal IWR, the second pre-write signal PWF, and the second internal write signal IWF based on the sixth shift control signal SC<6>, the first to fifth latch selection signals LS<1:5>, first and second output selection signals MS<1:2>, the first shift clock signal SCLKR, and the second shift clock signal SCLKF. The shift circuit 133 may shift the first pre-write signal PWR or the first internal write signal IWR by a shift period, which is set by the sixth shift control signal SC<6> and the first to fifth latch selection signals LS<1:5>, to generate the first shift write signal CWR. The shift circuit 133 may generate the first shift write signal CWR from the first internal write signal IWR based on the first and second output selection signals MS<1:2>. The first output selection signal MS<1> may be activated when the compensation latency is set as 8 cycles (i.e., 16 cycles of the clock signal CLK) of the first shift clock signal SCLKR. The second output selection signal MS<2> may be activated when the compensation latency is set as 7 cycles (i.e., 14 cycles of the clock signal CLK) of the first shift clock signal SCLKR. The shift circuit 133 may shift the first internal write signal IWR by one cycle of the first shift clock signal SCLKR to generate the first shift write signal CWR when the first output selection signal MS<1> is activated. The shift circuit 133 may output the first internal write signal IWR as the first shift write signal CWR when the second output selection signal MS<2> is activated.

The shift circuit 133 may shift the second pre-write signal PWF or the second internal write signal IWF by a shift period, which is set by the sixth shift control signal SC<6> and the first to fifth latch selection signals LS<1:5>, to generate the second shift write signal CWF. The shift circuit 133 may generate the second shift write signal CWF from the second internal write signal IWF based on the first and second output selection signals MS<1:2>. The shift circuit 133 may shift the second internal write signal IWF by one cycle of the second shift clock signal SCLKF to generate the second shift write signal CWF when the first output selection signal MS<1> is activated. The shift circuit 133 may output the second internal write signal IWF as the second shift write signal CWF when the second output selection signal MS<2> is activated. A configuration and an operation of the shift circuit 133 will be described in detail with reference to FIGS. 12, 13, and 14.

The column selection signal generation circuit 135 may shift the first shift write signal CWR and the second shift write signal CWF by a fixed shift period based on the first shift clock signal SCLKR and the second shift clock signal SCLKF to generate a column selection signal YI which is activated to select a column path transmitting data. The fixed shift period may be set as 7 cycles (i.e., 14 cycles of the clock signal CLK) of the first and second shift clock signals SCLKR and SCLKF.

Referring to FIG. 2, the internal write signal generation circuit 115 may include a decoded signal generation circuit 21, a mode write signal generation circuit 23, and an internal write signal output circuit 25. The decoded signal generation circuit 21 may include a first decoded signal generation circuit 211 and a second decoded signal generation circuit 213. The mode write signal generation circuit 23 may include a first mode write signal generation circuit 231 and a second mode write signal generation circuit 233.

The first decoded signal generation circuit 211 may decode the first internal control signal ICAR<1:L> based on the first internal chip selection signal ICSR to generate the first decoded signal DWR. The first decoded signal generation circuit 211 may be synchronized with the first internal chip selection signal ICSR to generate the first decoded signal DWR having a logic "high" level when the first internal control signal ICAR<1:L> having a first logic level combination is inputted to the first decoded signal generation circuit 211. The first logic level combination of the first internal control signal ICAR<1:L> may be set to be different according to the embodiments.

The second decoded signal generation circuit 213 may decode the second internal control signal ICAF<1:L> based on the second internal chip selection signal ICSF to generate the second decoded signal DWF. The second decoded signal generation circuit 213 may be synchronized with the second internal chip selection signal ICSF to generate the second decoded signal DWF having a logic "high" level when the second internal control signal ICAF<1:L> having a second logic level combination is inputted to the second decoded signal generation circuit 213. The second logic level combination of the second internal control signal ICAF<1:L> may be set to be different according to the embodiments.

The first mode write signal generation circuit 231 may shift the first decoded signal DWR based on the input mode signal MN and the first division clock signal DCLKR to generate the first mode write signal MWR. The first mode write signal generation circuit 231 may shift the first decoded signal DWR by a half cycle of the first division clock signal DCLKR to generate the first mode write signal MWR when the input mode signal MN having a first logic level is inputted to the first mode write signal generation circuit 231 in the first input mode. The first mode write signal generation circuit 231 may shift the first decoded signal DWR by one cycle of the first division clock signal DCLKR to generate the first mode write signal MWR when the input mode signal MN having a second logic level is inputted to the first mode write signal generation circuit 231 in the second input mode. The first logic level of the input mode signal MN may be set as a logic "low" level, and the second logic level of the input mode signal MN may be set as a logic "high" level. A configuration and an operation of the first mode write signal generation circuit 231 will be described in more detail with reference to FIG. 3.

The second mode write signal generation circuit 233 may shift the second decoded signal DWF based on the input mode signal MN and the second division clock signal DCLKF to generate the second mode write signal MWF. The second mode write signal generation circuit 233 may shift the second decoded signal DWF by a half cycle of the second division clock signal DCLKF to generate the second mode write signal MWF when the input mode signal MN having a logic "low" level is inputted to the second mode write signal generation circuit 233 in the first input mode. The second mode write signal generation circuit 233 may shift the second decoded signal DWF by one cycle of the second division clock signal DCLKF to generate the second mode write signal MWF when the input mode signal MN having a logic "high" level is inputted to the second mode write signal generation circuit 233 in the second input mode. A configuration and an operation of the second mode write signal generation circuit 233 will be described in more detail with reference to FIG. 4.

The internal write signal output circuit 25 may generate the first internal write signal IWR and the second internal write signal IWF based on the input mode signal MN, the odd mode signal MODD, the first mode write signal MWR, and the second mode write signal MWF. The internal write signal output circuit 25 may generate a selection control signal (SCNT of FIG. 5) based on the input mode signal MN and the odd mode signal MODD. The internal write signal output circuit 25 may generate the first internal write signal IWR and the second internal write signal IWF from the first mode write signal MWR and the second mode write signal MWF based on the selection control signal SCNT. A configuration and an operation of the internal write signal output circuit 25 will be described in detail with reference to FIGS. 5 to 8.

Figure 3:
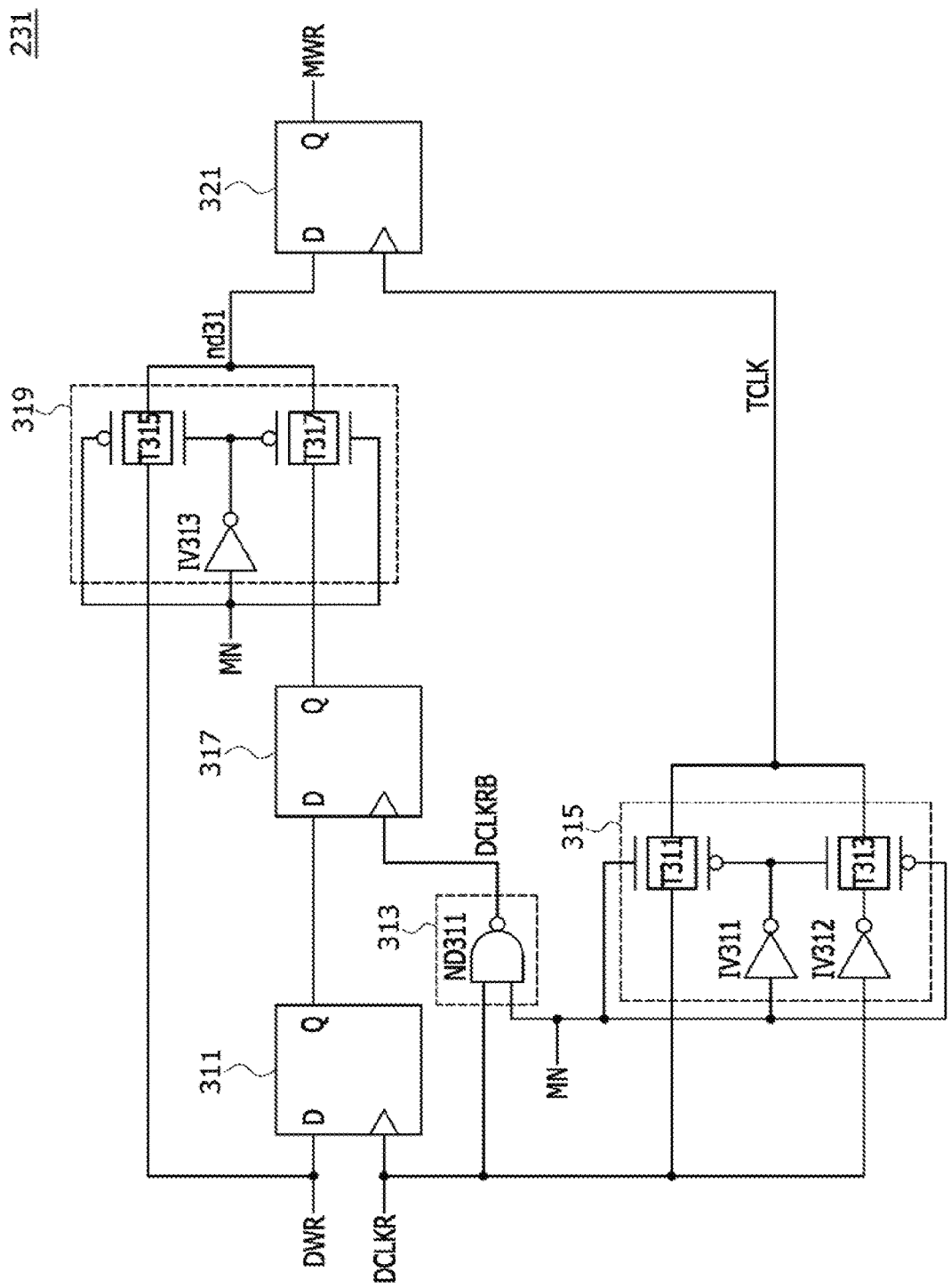
FIG. 3 is a circuit diagram illustrating a first mode write signal generation circuit included in the internal write signal generation circuit of FIG. 2.

Referring to FIG. 3, the first mode write signal generation circuit 231 may include flip-flops 311, 317 and 321, a clock inversion circuit 313, a transferred clock generation circuit 315, and a selection/transfer circuit 319. The flip-flop 311 may latch the first decoded signal DWR in synchronization with the first division clock signal DCLKR to output the latched signal of the first decoded signal DWR. The clock inversion circuit 313 may include a NAND gate ND311. The clock inversion circuit 313 may generate a first inverted division clock signal DCLKRB from the first division clock signal DCLKR based on the input mode signal MN. The clock inversion circuit 313 may generate the first inverted division clock signal DCLKRB having a logic "high" level when the input mode signal MN having a logic "low" level is inputted to the clock inversion circuit 313 in the first input mode. The clock inversion circuit 313 may inversely buffer the first division clock signal DCLKR to generate the first inverted division clock signal DCLKRB when the input mode signal MN having a logic "high" level is inputted to the clock inversion circuit 313 in the second input mode. The transferred clock generation circuit 315 may include inverters IV311 and IV312 and transfer gates T311 and T313. The transferred clock generation circuit 315 may generate a transferred clock signal TCLK from the first division clock signal DCLKR based on the input mode signal MN. The transferred clock generation circuit 315 may output the first division clock signal DCLKR as the transferred clock signal TCLK through the transfer gate T311 when the input mode signal MN having a logic "high" level is inputted to the transferred clock generation circuit 315 in the second input mode. The transferred clock generation circuit 315 may inversely buffer the first division clock signal DCLKR as the transferred clock signal TCLK through the inverter IV312 and the transfer gate T313 when the input mode signal MN having a logic "low" level is inputted to the transferred clock generation circuit 315 in the first input mode. The flip-flop 317 may latch an output signal of the flip-flop 311 in synchronization with the first inverted division clock signal DCLKRB to output the latched output signal of the flip-flop 311. The selection/transfer circuit 319 may include an inverter IV313 and transfer gates T315 and T317. The selection/transfer circuit 319 may output the first decoded signal DWR or an output signal of the flip-flop 317 to a node nd31 based on the input mode signal MN. The selection/transfer circuit 319 may output the first decoded signal DWR to the node nd31 through the transfer gate T315 when the input mode signal MN having a logic "low" level is inputted to the selection/transfer circuit 319 in the first input mode. The selection/transfer circuit 319 may output an output signal of the flip-flop 317 to the node nd31 through the transfer gate T317 when the input mode signal MN having a logic "high" level is inputted to the selection/transfer circuit 319 in the second input mode. The flip-flop 321 may latch a signal of the node nd31 in synchronization with the transferred clock signal TCLK to output the latched signal of the node nd31 as the first mode write signal MWR.

The first mode write signal generation circuit 231 may shift the first decoded signal DWR by a half cycle of the first division clock signal DCLKR to generate the first mode write signal MWR when the input mode signal MN having a logic "low" level is inputted to the first mode write signal generation circuit 231 in the first input mode. The first mode write signal generation circuit 231 may shift the first decoded signal DWR by one cycle of the first division clock signal DCLKR to generate the first mode write signal MWR when the input mode signal MN having a logic "high" level is inputted to the first mode write signal generation circuit 231 in the second input mode.

Figure 4:
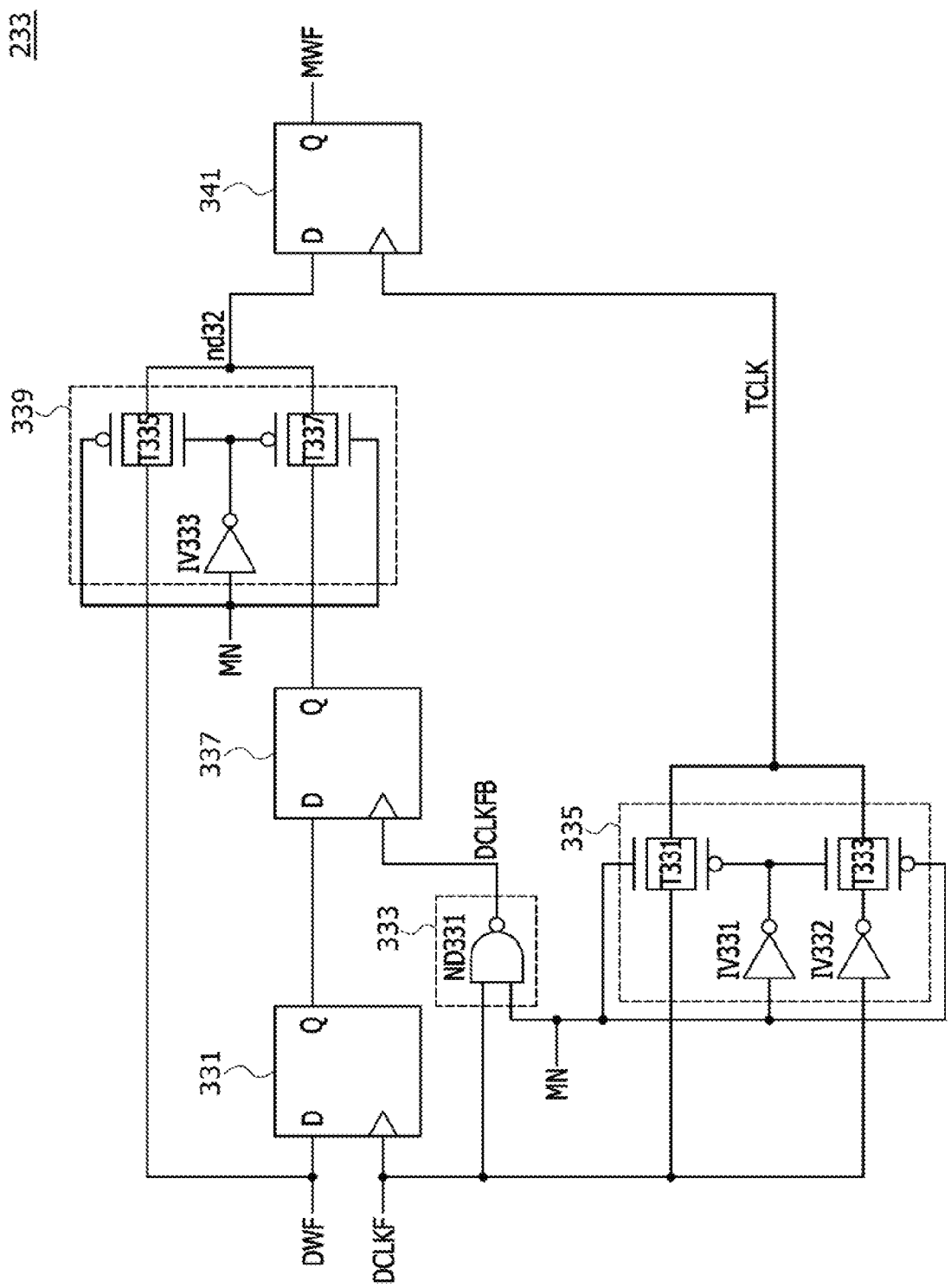
FIG. 4 is a circuit diagram illustrating a second mode write signal generation circuit included in the internal write signal generation circuit of FIG. 2.

Referring to FIG. 4, the second mode write signal generation circuit 233 may include flip-flops 331, 337 and 341, a clock inversion circuit 333, a transferred clock generation circuit 335, and a selection/transfer circuit 339. The flip-flop 331 may latch the second decoded signal DWF in synchronization with the second division clock signal DCLKF to output the latched signal of the second decoded signal DWF. The clock inversion circuit 333 may include a NAND gate ND331. The clock inversion circuit 333 may generate a second inverted division clock signal DCLKFB from the second division clock signal DCLKF based on the input mode signal MN. The clock inversion circuit 333 may generate the second inverted division clock signal DCLKFB having a logic "high" level when the input mode signal MN having a logic "low" level is inputted to the clock inversion circuit 333 in the first input mode. The clock inversion circuit 333 may inversely buffer the second division clock signal DCLKF to generate the second inverted division clock signal DCLKFB when the input mode signal MN having a logic "high" level is inputted to the clock inversion circuit 333 in the second input mode. The transferred clock generation circuit 335 may include inverters IV331 and IV332 and transfer gates T331 and T333. The transferred clock generation circuit 335 may generate a transferred clock signal TCLK from the second division clock signal DCLKF based on the input mode signal MN. The transferred clock generation circuit 335 may output the second division clock signal DCLKF as the transferred clock signal TCLK through the transfer gate T331 when the input mode signal MN having a logic "high" level is inputted to the transferred clock generation circuit 335 in the second input mode. The transferred clock generation circuit 335 may inversely buffer the second division clock signal DCLKF as the transferred clock signal TCLK through the inverter IV332 and the transfer gate T333 when the input mode signal MN having a logic "low" level is inputted to the transferred clock generation circuit 335 in the first input mode. The flip-flop 337 may latch an output signal of the flip-flop 331 in synchronization with the second inverted division clock signal DCLKFB to output the latched output signal of the flip-flop 331. The selection/transfer circuit 339 may include an inverter IV333 and transfer gates T335 and T337. The selection/transfer circuit 339 may output the second decoded signal DWF or an output signal of the flip-flop 337 to a node nd32 based on the input mode signal MN. The selection/transfer circuit 339 may output the second decoded signal DWF to the node nd32 through the transfer gate T335 when the input mode signal MN having a logic "low" level is inputted to the selection/transfer circuit 339 in the first input mode. The selection/transfer circuit 339 may output an output signal of the flip-flop 337 to the node nd32 through the transfer gate T337 when the input mode signal MN having a logic "high" level is inputted to the selection/transfer circuit 339 in the second input mode. The flip-flop 341 may latch a signal of the node nd32 in synchronization with the transferred clock signal TCLK to output the latched signal of the node nd32 as the second mode write signal MWF.

The second mode write signal generation circuit 233 may shift the second decoded signal DWF by a half cycle of the second division clock signal DCLKF to generate the second mode write signal MWF when the input mode signal MN having a logic "low" level is inputted to the second mode write signal generation circuit 233 in the first input mode. The second mode write signal generation circuit 233 may shift the second decoded signal DWF by one cycle of the second division clock signal DCLKF to generate the second mode write signal MWF when the input mode signal MN having a logic "high" level is inputted to the second mode write signal generation circuit 233 in the second input mode.

Figure 5:
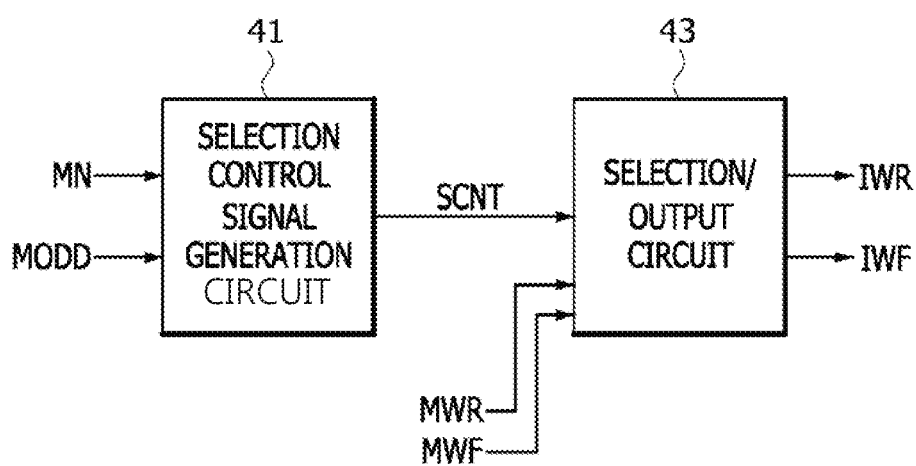
FIG. 5 is a block diagram illustrating a configuration of an internal write signal output circuit included in the internal write signal generation circuit of FIG. 2.

Referring to FIG. 5, the internal write signal output circuit 25 may include a selection control signal generation circuit 41 and a selection/output circuit 43.

The selection control signal generation circuit 41 may generate the selection control signal SCNT based on the input mode signal MN and the odd mode signal MODD. The selection control signal generation circuit 41 may receive the input mode signal MN having a first logic level and the odd mode signal MODD having the first logic level to generate the selection control signal SCNT having the first logic level when the write latency is set to have an even number in the first input mode. The selection control signal generation circuit 41 may receive the input mode signal MN having a second logic level and the odd mode signal MODD having the first logic level to generate the selection control signal SCNT having the second logic level when the write latency is set to have an even number in the second input mode. The selection control signal generation circuit 41 may receive the input mode signal MN having the first logic level and the odd mode signal MODD having the second logic level to generate the selection control signal SCNT having the second logic level when the write latency is set to have an odd number in the first input mode. The selection control signal generation circuit 41 may receive the input mode signal MN having the second logic level and the odd mode signal MODD having the second logic level to generate the selection control signal SCNT having the first logic level when the write latency is set to have an odd number in the second input mode. In the above description of the selection control signal generation circuit 41 and the following description of the selection/output circuit 43, the first logic level may be set as a logic "low" level, and the second logic level may be set as a logic "high" level.

The selection/output circuit 43 may generate the first internal write signal IWR and the second internal write signal IWF from the first mode write signal MWR and the second mode write signal MWF based on the selection control signal SCNT. The selection/output circuit 43 may output the first mode write signal MWR as the first internal write signal IWR and may output the second mode write signal MWF as the second internal write signal IWF, when the selection control signal SCNT has the second logic level. The selection/output circuit 43 may output the first mode write signal MWR as the second internal write signal IWF and may output the second mode write signal MWF as the first internal write signal IWR, when the selection control signal SCNT has the first logic level.

Figure 6:
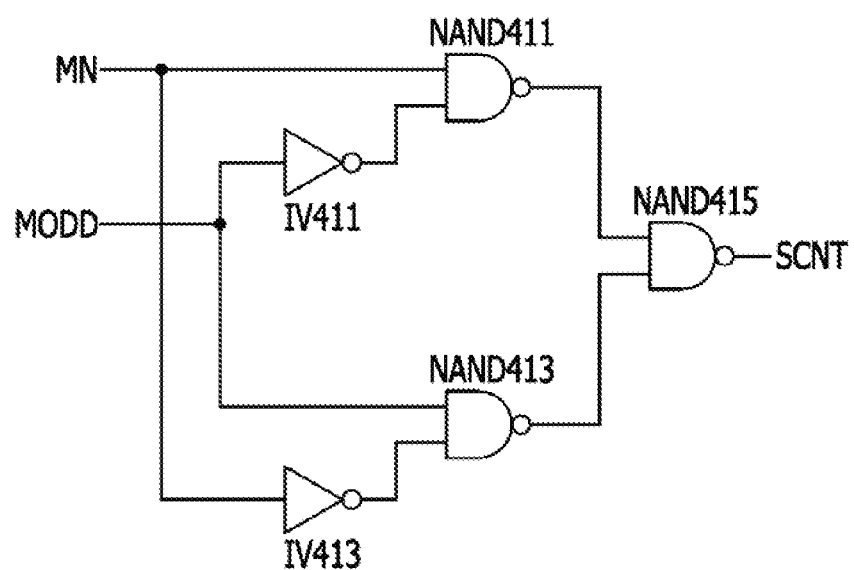
FIG. 6 is a circuit diagram illustrating a selection control signal generation circuit included in the internal write signal output circuit of FIG. 5.

Referring to FIG. 6, the selection control signal generation circuit 41 may include inverters IV411 and IV413 and NAND gates NAND411, NAND413 and NAND415. The inverter IV411 may inversely buffer the odd mode signal MODD to output the inversely latched signal of the odd mode signal MODD. The inverter IV413 may inversely buffer the input mode signal MN to output the inversely latched signal of the input mode signal MN. The NAND gate NAND411 may receive the input mode signal MN and an output signal of the inverter IV411 to perform a logical NAND operation of the input mode signal MN and an output signal of the inverter IV411. The NAND gate NAND413 may receive the odd mode signal MODD and an output signal of the inverter IV413 to perform a logical NAND operation of the odd mode signal MODD and an output signal of the inverter IV413. The NAND gate NAND415 may perform a logical NAND operation of an output signal of the NAND gate NAND411 and an output signal of the NAND gate NAND413 to generate the selection control signal SCNT.

Figure 7:
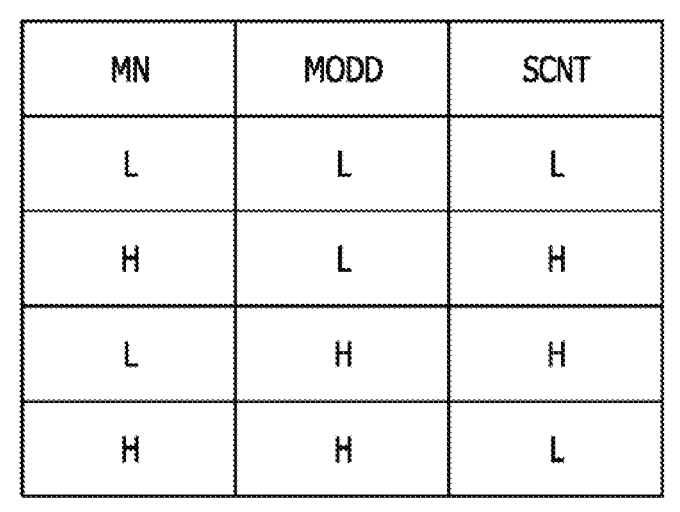

Referring to FIG. 7, logic levels of the selection control signal SCNT generated by the selection control signal generation circuit 41 according to logic level combinations of the input mode signal MN and the odd mode signal MODD are listed. The selection control signal generation circuit 41 may receive the input mode signal MN having a logic "low" level and the odd mode signal MODD having a logic "low" level to generate the selection control signal SCNT having a logic "low" level when the write latency is set to have an even number in the first input mode. The selection control signal generation circuit 41 may receive the input mode signal MN having a logic "high" level and the odd mode signal MODD having a logic "low" level to generate the selection control signal SCNT having a logic "high" level when the write latency is set to have an even number in the second input mode. The selection control signal generation circuit 41 may receive the input mode signal MN having a logic "low" level and the odd mode signal MODD having a logic "high" level to generate the selection control signal SCNT having a logic "high" level when the write latency is set to have an odd number in the first input mode. The selection control signal generation circuit 41 may receive the input mode signal MN having a logic "high" level and the odd mode signal MODD having a logic "high" level to generate the selection control signal SCNT having a logic "low" level when the write latency is set to have an odd number in the second input mode.

Figure 8:
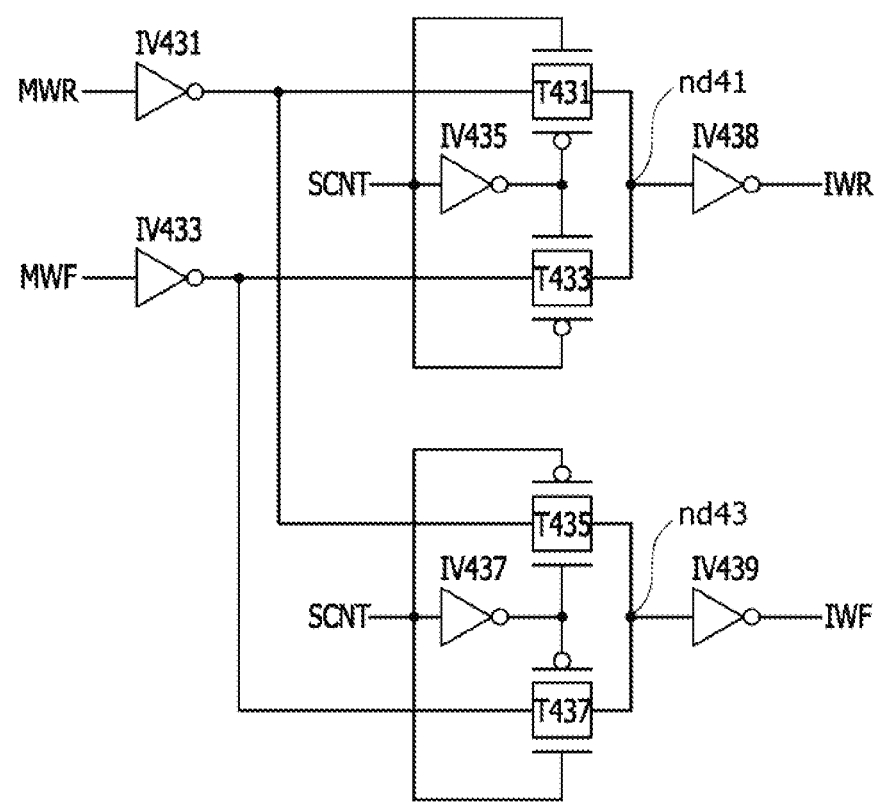
FIG. 8 is a circuit diagram illustrating a selection/output circuit included in the internal write signal output circuit of FIG. 5.

Referring to FIG. 8, the selection/output circuit 43 may include inverters IV431, IV433, IV435, IV437, IV438, and IV439 and transfer gates T431, T433, T435, and T437. The inverter IV431 may inversely buffer the first mode write signal MWR to output the inversely buffered signal of the first mode write signal MWR. The inverter IV433 may inversely buffer the second mode write signal MWF to output the inversely buffered signal of the second mode write signal MWF. The transfer gate T431 may be turned on to output an output signal of the inverter IV431 to a node nd41 when the selection control signal SCNT has a logic "high" level. The transfer gate T433 may be turned on to output an output signal of the inverter IV433 to the node nd41 when the selection control signal SCNT has a logic "low" level. The transfer gate T435 may be turned on to output an output signal of the inverter IV431 to a node nd43 when the selection control signal SCNT has a logic "low" level. The transfer gate T437 may be turned on to output an output signal of the inverter IV433 to the node nd43 when the selection control signal SCNT has a logic "high" level. The inverter IV438 may inversely buffer a signal of the node nd41 to output the inversely buffered signal of the signal of the node nd41 as the first internal write signal IWR. The inverter IV439 may inversely buffer a signal of the node nd43 to output the inversely buffered signal of the signal of the node nd43 as the second internal write signal IWF.

The selection/output circuit 43 may output the first mode write signal MWR as the first internal write signal IWR and may output the second mode write signal MWF as the second internal write signal IWF, when the selection control signal SCNT has a logic "high" level. The selection/output circuit 43 may output the first mode write signal MWR as the second internal write signal IWF and may output the second mode write signal MWF as the first internal write signal IWR, when the selection control signal SCNT has a logic "low" level.

Referring to FIG. 9, various logic level combinations of the first to sixth shift control signals SC<1:6> and the first to fifth latch selection signals LS<1:5> generated according to compensation latencies CWL-OFFSET, which are created by subtracting a compensation value set by the first to $N^{th}$ offset codes COFF<1:N> from the write latency set by the first to $M^{th}$ write latency codes CWL<1:M>, are listed. When the compensation latency CWL-OFFSET is "64", the first shift control signal SC<1> may be generated to have a logic "low" level, all of the second to sixth shift control signals SC<2:6> may be generated to have a logic "high" level, all of the first to fourth latch selection signals LS<1:4> may be generated to have a logic "low" level, and the fifth latch selection signal LS<5> may be generated to have a logic "high" level. When the compensation latency CWL-OFFSET is "62", the first shift control signal SC<1> may be generated to have a logic "low" level, all of the second to sixth shift control signals SC<2:6> may be generated to have a logic "high" level, the first to third latch selection signals LS<1:3> and the fifth latch selection signal LS<5> may be generated to have a logic "low" level, and the fourth latch selection signal LS<4> may be generated to have a logic "high" level. When the compensation latency CWL-OFFSET is "18", all of the first to sixth shift control signals SC<1:6> may be generated to have a logic "low" level, the first latch selection signal LS<1> and the third to fifth latch selection signals LS<3:5> may be generated to have a logic "low" level, and the second latch selection signal LS<2> may be generated to have a logic "high" level.

Figure 10:
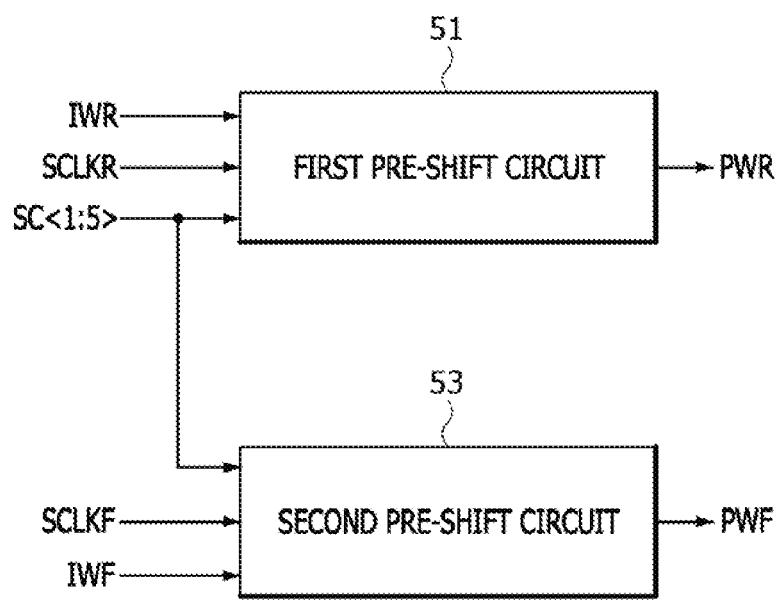
FIG. 10 is a block diagram illustrating a configuration of a pre-shift circuit included in the semiconductor device of FIG. 1.

Referring to FIG. 10, the pre-shift circuit 131 may include a first pre-shift circuit 51 and a second pre-shift circuit 53. The first pre-shift circuit 51 may generate the first pre-write signal PWR from the first internal write signal IWR based on the first to fifth shift control signals SC<1:5> and the first shift clock signal SCLKR. The first pre-shift circuit 51 may shift the first internal write signal IWR by the pre-shift period set by the first to fifth shift control signals SC<1:5> to generate the first pre-write signal PWR. The second pre-shift circuit 53 may generate the second pre-write signal PWF from the second internal write signal IWF based on the first to fifth shift control signals SC<1:5> and the second shift clock signal SCLKF. The second pre-shift circuit 53 may shift the second internal write signal IWF by the pre-shift period set by the first to fifth shift control signals SC<1:5> to generate the second pre-write signal PWF.

Figure 11:
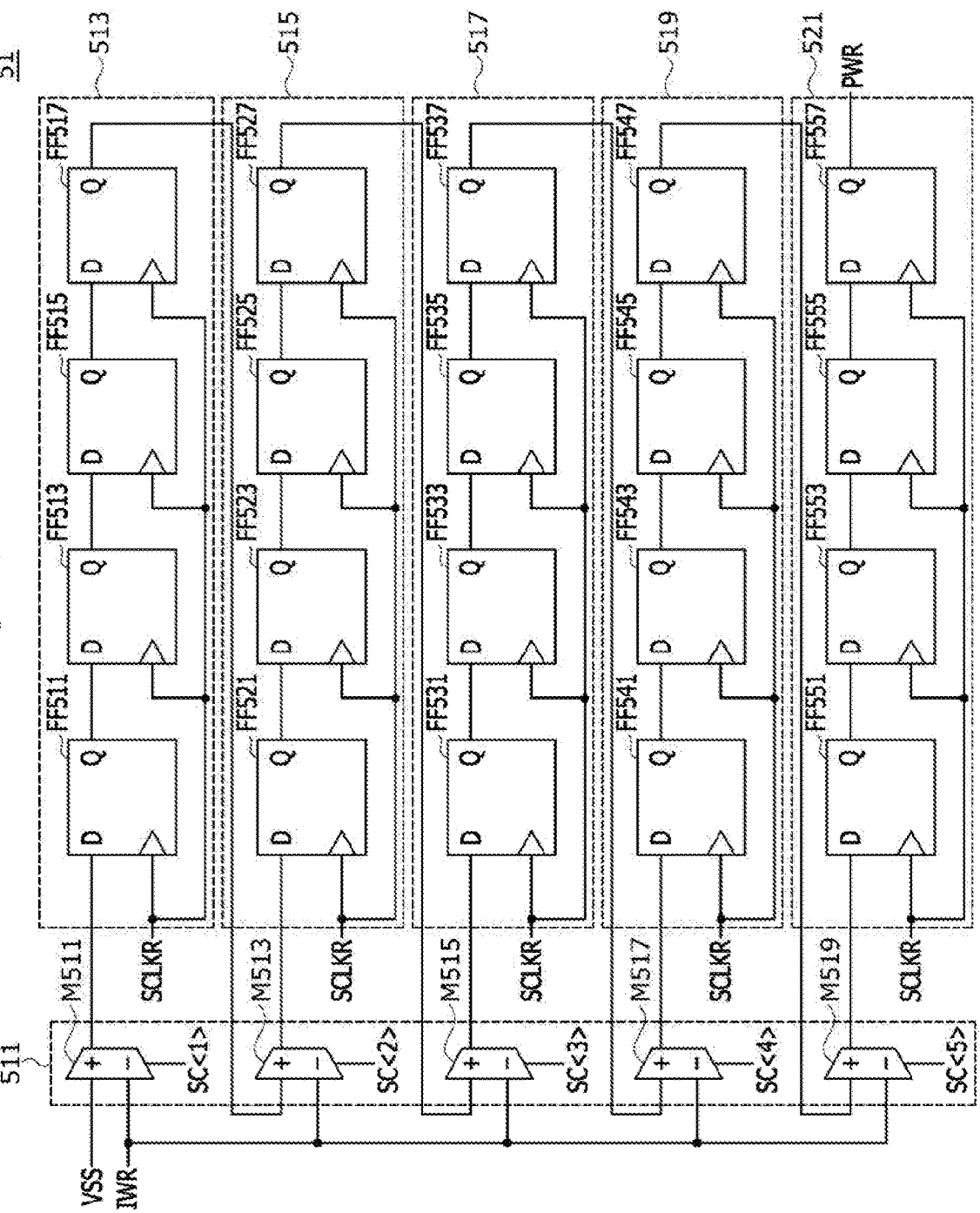
FIG. 11 is a circuit diagram illustrating a first pre-shift circuit included in the pre-shift circuit of FIG. 10.

Referring to FIG. 11, the first pre-shift circuit 51 may include a selection/input circuit 511, a first pre-period shifter 513, a second pre-period shifter 515, a third pre-period shifter 517, a fourth pre-period shifter 519, and a fifth pre-period shifter 521. The selection/input circuit 511 may include multiplexers M511, M513, M515, M517, and M519. The first pre-period shifter 513 may include flip-flops FF511, FF513, FF515, and FF517 which are synchronized with the first shift clock signal SCLKR to operate. The second pre-period shifter 515 may include flip-flops FF521, FF523, FF525, and FF527 which are synchronized with the first shift clock signal SCLKR to operate. The third pre-period shifter 517 may include flip-flops FF531, FF533, FF535, and FF537 which are synchronized with the first shift clock signal SCLKR to operate. The fourth pre-period shifter 519 may include flip-flops FF541, FF543, FF545, and FF547 which are synchronized with the first shift clock signal SCLKR to operate. The fifth pre-period shifter 521 may include flip-flops FF551, FF553, FF555, and FF557 which are synchronized with the first shift clock signal SCLKR to operate.

The multiplexer M511 may output a ground voltage VSS when the first shift control signal SC<1> has a logic "high" level and may output the first internal write signal IWR when the first shift control signal SC<1> has a logic "low" level. The first pre-period shifter 513 may shift an output signal of the multiplexer M511 by 4 cycles (i.e., 8 cycles of the clock signal CLK) of the first shift clock signal SCLKR through the flip-flops FF511, FF513, FF515 and FF517 to output the shifted signal of the output signal of the multiplexer M511. The multiplexer M513 may output an output signal of the first pre-period shifter 513 when the second shift control signal SC<2> has a logic "high" level and may output the first internal write signal IWR when the second shift control signal SC<2> has a logic "low" level. The second pre-period shifter 515 may shift an output signal of the multiplexer M513 by 4 cycles (i.e., 8 cycles of the clock signal CLK) of the first shift clock signal SCLKR through the flip-flops FF521, FF523, FF525 and FF527 to output the shifted signal of the output signal of the multiplexer M513. The multiplexer M515 may output an output signal of the second pre-period shifter 515 when the third shift control signal SC<3> has a logic "high" level and may output the first internal write signal IWR when the third shift control signal SC<3> has a logic "low" level. The third pre-period shifter 517 may shift an output signal of the multiplexer M515 by 4 cycles (i.e., 8 cycles of the clock signal CLK) of the first shift clock signal SCLKR through the flip-flops FF531, FF533, FF535 and FF537 to output the shifted signal of the output signal of the multiplexer M515. The multiplexer M517 may output an output signal of the third pre-period shifter 517 when the fourth shift control signal SC<4> has a logic "high" level and may output the first internal write signal IWR when the fourth shift control signal SC<4> has a logic "low" level. The fourth pre-period shifter 519 may shift an output signal of the multiplexer M517 by 4 cycles (i.e., 8 cycles of the clock signal CLK) of the first shift clock signal SCLKR through the flip-flops FF541, FF543, FF545 and FF547 to output the shifted signal of the output signal of the multiplexer M517. The multiplexer M519 may output an output signal of the fourth pre-period shifter 519 when the fifth shift control signal SC<5> has a logic "high" level and may output the first internal write signal IWR when the fifth shift control signal SC<5> has a logic "low" level. The fifth pre-period shifter 521 may shift an output signal of the multiplexer M519 by 4 cycles (i.e., 8 cycles of the clock signal CLK) of the first shift clock signal SCLKR through the flip-flops FF551, FF553, FF555 and FF557 to output the shifted signal of the output signal of the multiplexer M519 as the first pre-write signal PWR.

The first pre-shift circuit 51 may shift the first internal write signal IWR by 20 cycles (i.e., 40 cycles of the clock signal CLK) of the first shift clock signal SCLKR to generate and output the first pre-write signal PWR when the first shift control signal SC<1> is generated to have a logic "low" level and all of the second to fifth shift control signals SC<2:5> are generated to have a logic "high" level. When the first shift control signal SC<1> is generated to have a logic "low" level and all of the second to fifth shift control signals SC<2:5> are generated to have a logic "high" level, the pre-shift period may be set to be 20 cycles of the first shift clock signal SCLKR.

The first pre-shift circuit 51 may shift the first internal write signal IWR by 16 cycles (i.e., 32 cycles of the clock signal CLK) of the first shift clock signal SCLKR to generate and output the first pre-write signal PWR when the first and second shift control signals SC<1:2> are generated to have a logic "low" level and the third to fifth shift control signals SC<3:5> are generated to have a logic "high" level. When the first and second shift control signals SC<1:2> are generated to have a logic "low" level and the third to fifth shift control signals SC<3:5> are generated to have a logic "high" level, the pre-shift period may be set to be 16 cycles of the first shift clock signal SCLKR.

The first pre-shift circuit 51 may shift the first internal write signal IWR by 12 cycles (i.e., 24 cycles of the clock signal CLK) of the first shift clock signal SCLKR to generate and output the first pre-write signal PWR when the first to third shift control signals SC<1:3> are generated to have a logic "low" level and the fourth and fifth shift control signals SC<4:5> are generated to have a logic "high" level. When the first to third shift control signals SC<1:3> are generated to have a logic "low" level and the fourth and fifth shift control signals SC<4:5> are generated to have a logic "high" level, the pre-shift period may be set to be 12 cycles of the first shift clock signal SCLKR.

The first pre-shift circuit 51 may shift the first internal write signal IWR by 8 cycles (i.e., 16 cycles of the clock signal CLK) of the first shift clock signal SCLKR to generate and output the first pre-write signal PWR when the first to fourth shift control signals SC<1:4> are generated to have a logic "low" level and the fifth shift control signal SC<5> is generated to have a logic "high" level. When the first to fourth shift control signals SC<1:4> are generated to have a logic "low" level and the fifth shift control signal SC<5> is generated to have a logic "high" level, the pre-shift period may be set to be 8 cycles of the first shift clock signal SCLKR.

The first pre-shift circuit 51 may shift the first internal write signal IWR by 4 cycles (i.e., 8 cycles of the clock signal CLK) of the first shift clock signal SCLKR to generate and output the first pre-write signal PWR when all of the first to fifth shift control signals SC<1:5> are generated to have a logic "low" level. When all of the first to fifth shift control signals SC<1:5> are generated to have a logic "low" level, the pre-shift period may be set to be 4 cycles of the first shift clock signal SCLKR.

Figure 12:
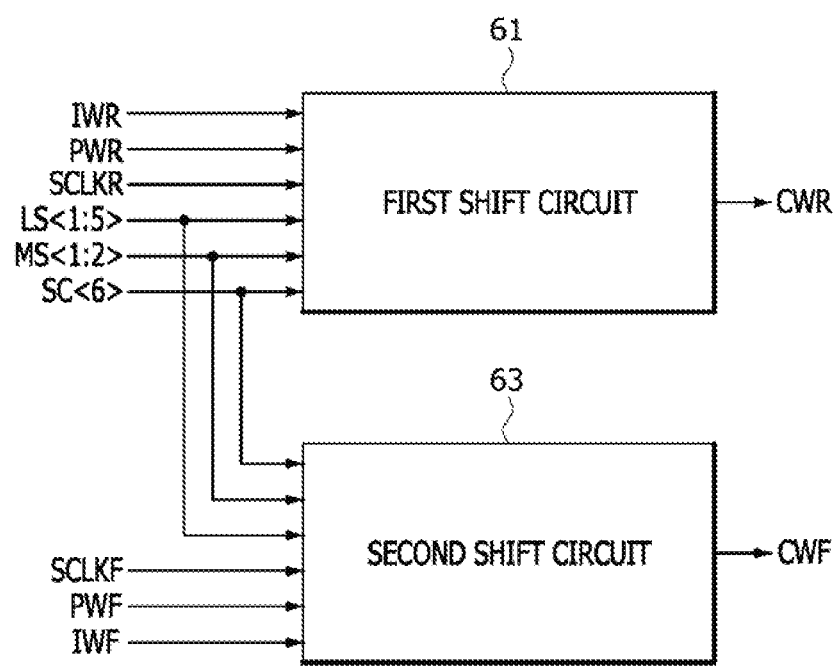
FIG. 12 is a block diagram illustrating a configuration of a shift circuit included in the semiconductor device of FIG. 1.

Referring to FIG. 12, the shift circuit 133 may include a first shift circuit 61 and a second shift circuit 63.

The first shift circuit 61 may generate the first shift write signal CWR from the first pre-write signal PWR and the first internal write signal IWR based on the sixth shift control signal SC<6>, the first to fifth latch selection signals LS<1:5>, the first and second output selection signals MS<1:2>, and the first shift clock signal SCLKR. The first shift circuit 61 may be synchronized with the first shift clock signal SCLKR to shift the first pre-write signal PWR or the first internal write signal IWR according to a logic level of the sixth shift control signal SC<6>, a logic level combination of the first to fifth latch selection signals LS<1:5>, and a logic level combination of the first and second output selection signals MS<1:2> and to generate the first shift write signal CWR. The second shift circuit 63 may generate the second shift write signal CWF from the second pre-write signal PWF and the second internal write signal IWF based on the sixth shift control signal SC<6>, the first to fifth latch selection signals LS<1:5>, the first and second output selection signals MS<1:2>, and the second shift clock signal SCLKF. The second shift circuit 63 may be synchronized with the second shift clock signal SCLKF to shift the second pre-write signal PWF or the second internal write signal IWF according to a logic level of the sixth shift control signal SC<6>, a logic level combination of the first to fifth latch selection signals LS<1:5>, and a logic level combination of the first and second output selection signals MS<1:2> and to generate the second shift write signal CWF.

Figure 13:
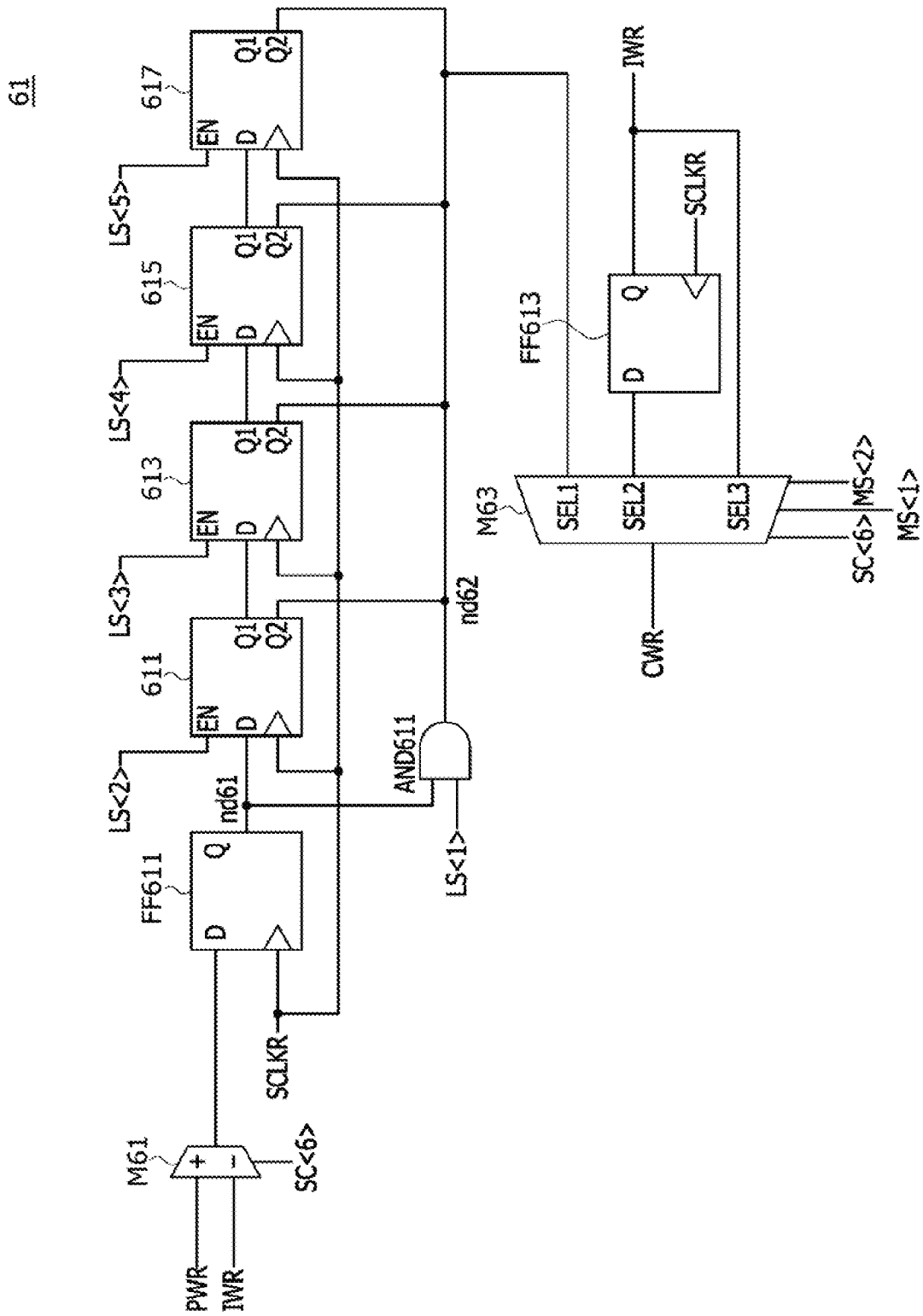
FIG. 13 is a circuit diagram illustrating a first shift circuit included in the shift circuit of FIG. 12.

Referring to FIG. 13, the first shift circuit 61 may include multiplexers M61 and M63, flip-flops FF611 and FF613, an AND gate AND611, and selection/output flip-flops 611, 613, 615 and 617.

The multiplexer M61 may select the first pre-write signal PWR or the first internal write signal IWR based on the sixth shift control signal SC<6> to output the selected signal. The multiplexer M61 may output the first pre-write signal PWR when the compensation latency is set to be within the range from 13 cycles to 32 cycles (i.e., from 26 cycles to 64 cycles of the clock signal CLK) of the first shift clock signal SCLKR so that the sixth shift control signal SC<6> has a logic "high" level. The multiplexer M61 may output the first internal write signal IWR when the compensation latency is set to be within the range from 9 cycles to 12 cycles (i.e., from 18 cycles to 24 cycles of the clock signal CLK) of the first shift clock signal SCLKR so that the sixth shift control signal SC<6> has a logic "low" level.

The flip-flop FF611 may be synchronized with the first shift clock signal SCLKR to latch an output signal of the multiplexer M61 and may output the latched output signal of the multiplexer M61 to a node nd61. The AND gate AND611 may perform a logical AND operation of a signal of the node nd61 and the first latch selection signal LS<1> to output the result of the logical AND operation. The AND gate AND611 may buffer a signal of the node nd61 to output the buffered signal of the signal of the node nd61 to a node nd62 when the first latch selection signal LS<1> has a logic "high" level. The selection/output flip-flop 611 may latch an output signal of the flip-flop FF611 in synchronization with the first shift clock signal SCLKR to output the latched signal of the output signal of the flip-flop FF611 through a first output terminal Q1 and to output the latched signal of the output signal of the flip-flop FF611 to the node nd62 through a second output terminal Q2 when the second latch selection signal LS<2> has a logic "high" level. The selection/output flip-flop 613 may latch an output signal of the selection/output flip-flop 611 in synchronization with the first shift clock signal SCLKR to output the latched signal of the output signal of the selection/output flip-flop 611 through a first output terminal Q1 and to output the latched signal of the output signal of the selection/output flip-flop 611 to the node nd62 through a second output terminal Q2 when the third latch selection signal LS<3> has a logic "high" level. The selection/output flip-flop 615 may latch an output signal of the selection/output flip-flop 613 in synchronization with the first shift clock signal SCLKR to output the latched signal of the output signal of the selection/output flip-flop 613 through a first output terminal Q1 and to output the latched signal of the output signal of the selection/output flip-flop 613 to the node nd62 through a second output terminal Q2 when the fourth latch selection signal LS<4> has a logic "high" level. The selection/output flip-flop 617 may latch an output signal of the selection/output flip-flop 615 in synchronization with the first shift clock signal SCLKR to output the latched signal of the output signal of the selection/output flip-flop 615 through a first output terminal Q1 and to output the latched signal of the output signal of the selection/output flip-flop 615 to the node nd62 through a second output terminal Q2 when the fifth latch selection signal LS<5> has a logic "high" level.

The flip-flop FF613 may be synchronized with the first shift clock signal SCLKR to latch the first internal write signal IWR and may output the latched signal of the first internal write signal IWR. The multiplexer M63 may select one among a signal of the node nd62, an output signal of the flip-flop FF613, and the first internal write signal IWR based on the sixth shift control signal SC<6>, the first output selection signal MS<1>, and the second output selection signal MS<2> to output the selected signal as the first shift write signal CWR. The multiplexer M63 may output the signal of the node nd62 as the first shift write signal CWR when the compensation latency is set to be within the range from 9 cycles to 32 cycles (i.e., from 18 cycles to 64 cycles of the clock signal CLK) of the first shift clock signal SCLKR so that the sixth shift control signal SC<6> has a logic "high" level and both of the first and second output selection signals MS<1:2> have a logic "low" level. The multiplexer M63 may output the output signal of the flip-flop FF613 as the first shift write signal CWR when the compensation latency is set to be 8 cycles (i.e., 16 cycles of the clock signal CLK) of the first shift clock signal SCLKR so that both of the sixth shift control signal SC<6> and the second output selection signal MS<2> have a logic "low" level and the first output selection signal MS<1> has a logic "high" level. The multiplexer M63 may output the first internal write signal IWR as the first shift write signal CWR when the compensation latency is set to be 7 cycles (i.e., 14 cycles of the clock signal CLK) of the first shift clock signal SCLKR so that both of the sixth shift control signal SC<6> and the first output selection signal MS<1> have a logic "low" level and the second output selection signal MS<2> has a logic "high" level.

Figure 14:
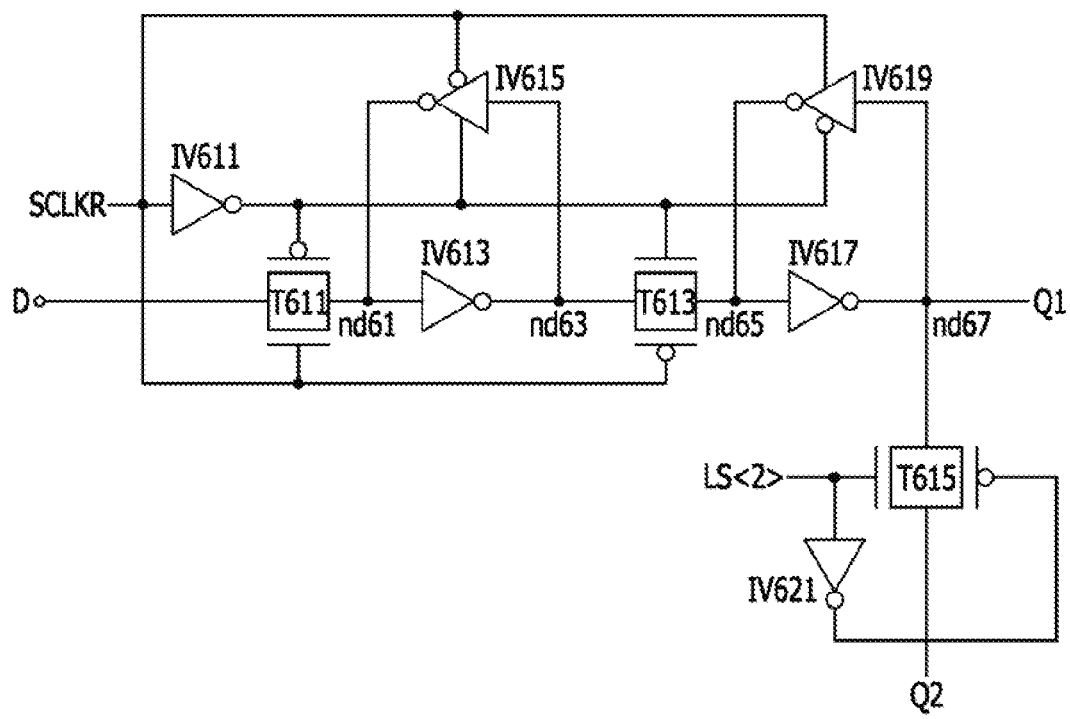
FIG. 14 is a circuit diagram illustrating a selection/output flip-flop included in the first shift circuit of FIG. 13.

Referring to FIG. 14, the selection/output flip-flop 611 may include inverters IV611, IV613, IV615, IV617, IV619 and IV621 and transfer gates T611, T613 and T615. The inverter IV611 may inversely buffer the first shift clock signal SCLKR to output the inversely buffered signal of the first shift clock signal SCLKR. The transfer gate T611 may be turned on to transfer a signal of an input terminal D of the selection/output flip-flop 611 to a node nd61 when the first shift clock signal SCLKR has a logic "high" level. The inverter IV613 may inversely buffer a signal of the node nd61 to output the inversely buffered signal of the signal of the node nd61 to a node nd63. The inverter IV615 may inversely buffer a signal of the node nd63 to output the inversely buffered signal of the signal of the node nd63 to the node nd61 when the first shift clock signal SCLKR has a logic "low" level. The transfer gate T613 may be turned on to transfer a signal of the node nd63 to a node nd65 when the first shift clock signal SCLKR has a logic "low" level. The inverter IV617 may inversely buffer a signal of the node nd65 to output the inversely buffered signal of the signal of the node nd65 to a node nd67 corresponding to the first output terminal Q1 of the selection/output flip-flop 611. The inverter IV619 may inversely buffer a signal of the node nd67 to output the inversely buffered signal of the signal of the node nd67 to the node nd65 when the first shift clock signal SCLKR has a logic "high" level. The inverter IV621 may inversely buffer the second latch selection signal LS<2> to output the inversely buffered signal of the second latch selection signal LS<2>. The transfer gate T615 may be turned on to transfer a signal of the node nd67 to the second output terminal Q2 of the selection/output flip-flop 611 when the second latch selection signal LS<2> has a logic "high" level.

The selection/output flip-flop 611 may latch a signal of the input terminal D of the selection/output flip-flop 611 in synchronization with the first shift clock signal SCLKR to output the latched signal of the signal of the input terminal D through the first output terminal Q1 of the selection/output flip-flop 611 and to output the latched signal of the signal of the input terminal D through the second output terminal Q2 of the selection/output flip-flop 611 when the second latch selection signal LS<2> has a logic "high" level. Each of the selection/output flip-flops 613, 615, and 617 may be realized to have substantially the same circuit as the selection/output flip-flop 611 illustrated in FIG. 14.

Operations of the semiconductor device 1 having the aforementioned configuration will be described hereinafter with reference to FIGS. 15 and 16.

Figure 15:
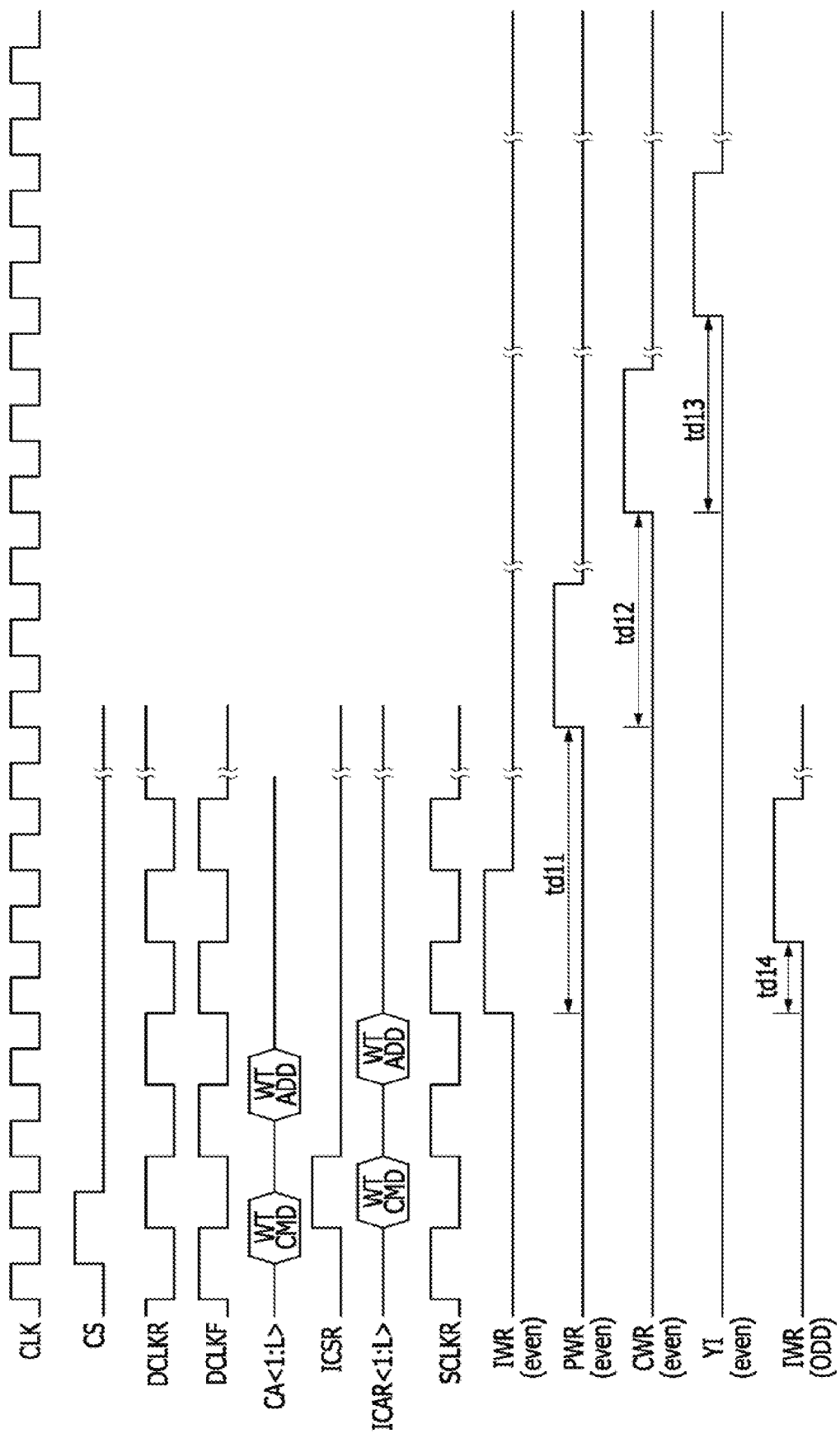
FIGS. 15 and 16 are timing diagrams illustrating operations of the semiconductor devices shown in FIG. 1.

As illustrated in FIG. 15, the clock signal CLK may be divided to generate the first division clock signal DCLKR and the second division clock signal DCLKF. The chip selection signal CS may be buffered in synchronization with the first division clock signal DCLKR to generate the first internal chip selection signal ICSR, and the control signal CA<1:L> may be buffered in synchronization with the first division clock signal DCLKR to generate the first internal control signal ICAR<1:L>. When a write command WT_CMD and a write address WT_ADD are inputted to the semiconductor device 1 through the control signal CA<1:L> for two cycles of the clock signal CLK while the write latency is set as an even number, the first internal write signal IWR may be generated at a time when one cycle of the first shift clock signal SCLKR elapses from a time when the first internal control signal ICAR<1:L> having a logic level combination for generating the write command WT_CMD is inputted while the first internal chip selection signal ICSR has a logic "high" level. The first pre-write signal PWR may be generated at a time when a pre-shift period td11 elapses from a time when the first internal write signal IWR is generated. The first shift write signal CWR may be generated at a time when a shift period td12 elapses from a time when the first pre-write signal PWR is generated. The column selection signal YI may be generated at a time when a fixed shift period td13 elapses from a time when the first shift write signal CWR is generated. Meanwhile, when the write latency is set as an odd number, the first internal write signal IWR may be generated to be shifted by a half cycle (td14) of the first shift clock signal SCLKR as compared with the first internal write signal IWR generated when the write latency is set as an even number. Thus, when the write latency is set as an odd number, the column selection signal YI generated from the first internal write signal IWR may also be generated to be shifted by a half cycle (td14) of the first shift clock signal SCLKR as compared with the column selection signal YI generated when the write latency is set as an even number.

Figure 16:
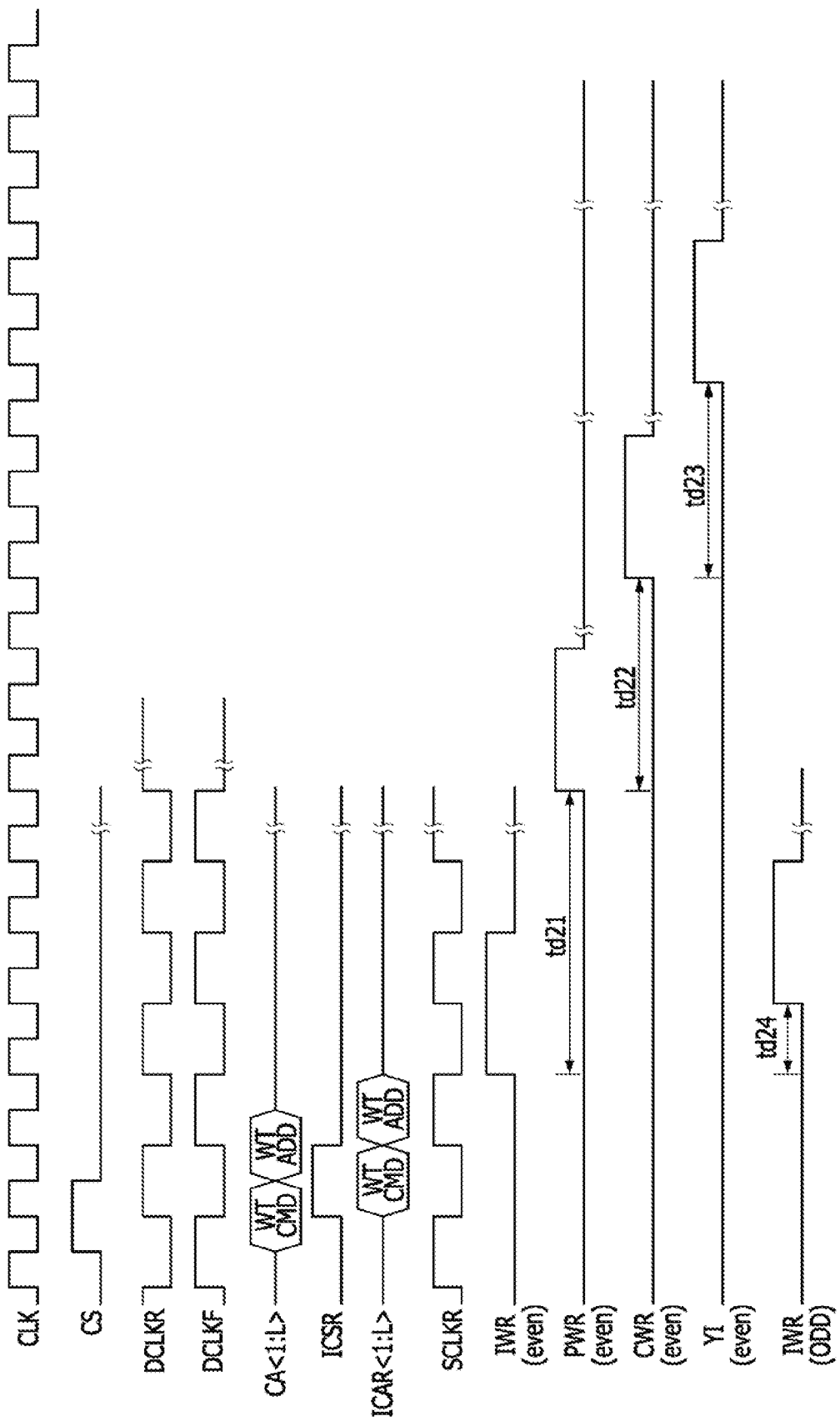

As illustrated in FIG. 16, when the write command WT_CMD and the write address WT_ADD are inputted to the semiconductor device 1 through the control signal CA<1:L> for one cycle of the clock signal CLK while the write latency is set as an even number, the first internal write signal IWR may be generated at a time when a half cycle of the first shift clock signal SCLKR elapses from a time when the first internal control signal ICAR<1:L> having a logic level combination for generating the write command WT_CMD is inputted while the first internal chip selection signal ICSR has a logic "high" level. The first pre-write signal PWR may be generated at a time when a pre-shift period td21 elapses from a time when the first internal write signal IWR is generated. The first shift write signal CWR may be generated at a time when a shift period td22 elapses from a time when the first pre-write signal PWR is generated. The column selection signal YI may be generated at a time when a fixed shift period td23 elapses from a time when the first shift write signal CWR is generated. Meanwhile, when the write latency is set as an odd number, the first internal write signal IWR may be generated to be shifted by a half cycle (td24) of the first shift clock signal SCLKR as compared with the first internal write signal IWR generated when the write latency is set as an even number. Thus, when the write latency is set as an odd number, the column selection signal YI generated from the first internal write signal IWR may also be generated to be shifted by a half cycle (td24) of the first shift clock signal SCLKR as compared with the column selection signal YI generated when the write latency is set as an even number.

The semiconductor device 1 according to an embodiment may generate the column selection signal YI by performing a shifting operation in advance from a time when the write command WT_CMD is inputted using the pre-shift circuit 131 that shifts an internal write signal by a pre-shift period which is set in units of "8×K" times a cycle of a clock signal. In addition, the semiconductor device 1 may be configured to include the pre-shift circuit 131, the shift circuit 133, and the column selection signal generation circuit 135, which are separated from each other, to perform a shifting operation by a compensation latency. Thus, the number of shift control signals necessary for the shifting operation may be minimized to reduce the fan-out between the shift circuits.

Figure 17:
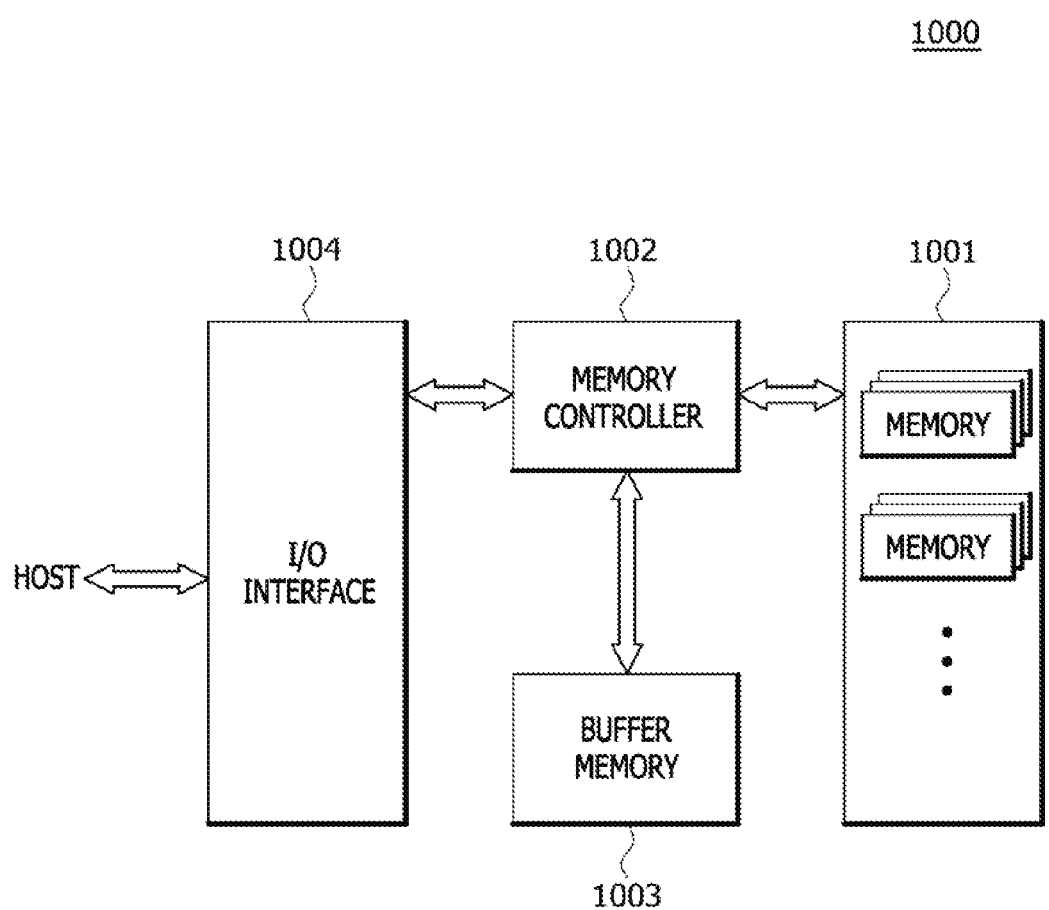
FIG. 17 is a block diagram illustrating a configuration of an electronic system employing the semiconductor device shown in FIG. 1.

The semiconductor device 1 described with reference to FIG. 1 may be applied to an electronic system that includes a memory system, a graphic system, a computing system, a mobile system, or the like. For example, as illustrated in FIG. 17, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated by the memory controller 1002. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 17 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM). The buffer memory 1003 may include the semiconductor device 1 illustrated in FIG. 1

The I/O interface 1004 may physically and electrically connect the memory controller 1002 to the external device (i.e., the host). Thus, the memory controller 1002 may receive control signals and data from the external device (i.e., the host) through the I/O interface 1004 and may output the data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a pre-shift circuit configured to shift an internal write signal by a pre-shift period to generate a pre-write signal; and
a shift circuit configured to shift the pre-write signal by a shift period to generate a shift write signal for generating a column selection signal,
wherein the column selection signal is activated to select a column path through which data are inputted or outputted,
wherein the pre-shift period is set as a period corresponding to a multiple of "L" times a cycle of a clock signal, and
wherein the "L" is a natural number which is equal to or greater than two.

2. The semiconductor device of claim 1, further comprising an internal write signal generation circuit configured to generate the internal write signal from an internal chip selection signal and an internal control signal based on an input mode signal and an odd mode signal.

3. The semiconductor device of claim 2,
wherein the input mode signal has a first logic level when a command and an address are inputted through a control signal during a period corresponding to "M" times the cycle of the clock signal;
wherein the input mode signal has a second logic level when the command and the address are inputted through the control signal during a period corresponding to "N" times the cycle of the clock signal; and
wherein "M" and "N" are set to be different natural numbers.

4. The semiconductor device of claim 2,
wherein the odd mode signal has a first logic level when a write latency is set as an even number; and
wherein the odd mode signal has a second logic level when the write latency is set as an odd number.

5. The semiconductor device of claim 2, wherein the internal write signal generation circuit comprises:
a decoded signal generation circuit configured to decode the internal control signal based on the internal chip selection signal to generate a decoded signal; and
a mode write signal generation circuit configured to generate a mode write signal from the decoded signal based on the input mode signal.

6. The semiconductor device of claim 5,
wherein the mode write signal comprises a first mode write signal and a second mode write signal;
wherein the internal write signal comprises a first internal write signal and a second internal write signal; and
wherein the internal write signal generation circuit further comprises an internal write signal output circuit configured to generate the first internal write signal and the second internal write signal from the first mode write signal and the second mode write signal based on the input mode signal and the odd mode signal.

7. The semiconductor device of claim 6, wherein the internal write signal output circuit comprises:
a selection control signal generation circuit configured to generate a selection control signal according to a logic level combination of the input mode signal and the odd mode signal; and
a selection/output circuit configured to, based on the selection control signal:
output the first mode write signal as the first internal write signal and output the second mode write signal as the second internal write signal; or
output the first mode write signal as the second internal write signal and output the second mode write signal as the first internal write signal.

8. The semiconductor device of claim 1, further comprising a shift control circuit configured to generate a shift control signal and a latch selection signal for setting the pre-shift period and the shift period.

9. The semiconductor device of claim 8,
wherein the shift control signal is configured to:
generate a quotient and a remainder by dividing a compensation latency by "k", wherein the compensation latency is set by a latency code and an offset code; and
generate the shift control signal having a logic level combination corresponding to the quotient and the latch selection signal having a logic level combination corresponding to the remainder; and
wherein "K" is a natural number which is equal to or greater than two.

10. The semiconductor device of claim 9,
wherein the latency code has a logic level combination corresponding to a write latency; and
wherein the offset code is set through a write leveling operation to have a logic level combination corresponding to a compensation value for compensating for the write latency.

11. The semiconductor device of claim 1, wherein the pre-shift circuit comprises:
a first multiplexer configured to output the internal write signal based on a first shift control signal;
a first pre-period shifter configured to shift an output signal of the first multiplexer by a first period;

a second multiplexer configured to selectively output the internal write signal or an output signal of the first pre-period shifter based on a second shift control signal; and a second pre-period shifter configured to shift an output signal of the second multiplexer by a second period.

12. The semiconductor device of claim 1, wherein the shift circuit comprises:

a first multiplexer configured to selectively output the pre-write signal or the internal write signal based on a shift control signal; and a second multiplexer configured to, based on the shift control signal and an output selection signal, selectively output the internal write signal or a signal generated by shifting an output signal of the first multiplexer based on a latch selection signal as the shift write signal.

13. A semiconductor device comprising:

an internal write signal generation circuit configured to, based on an input mode signal and an odd mode signal:
generate a first internal write signal from a first internal chip selection signal and a first internal control signal; and
generate a second internal write signal from a second internal chip selection signal and a second internal control signal;

a pre-shift circuit configured to shift the first internal write signal and the second internal write signal by a pre-shift period to generate a first pre-write signal and a second pre-write signal; and a shift circuit configured to shift the first pre-write signal and the second pre-write signal by a shift period to generate a first shift write signal and a second shift write signal for generating a column selection signal.

14. The semiconductor device of claim 13, wherein the first internal control signal is generated from a control signal which is inputted in synchronization with a first division clock signal;

wherein the first internal chip selection signal is generated from a chip selection signal which is inputted in synchronization with the first division clock signal;

wherein the second internal control signal is generated from the control signal which is inputted in synchronization with a second division clock signal; and wherein the second internal chip selection signal is generated from the chip selection signal which is inputted in synchronization with the second division clock signal.

15. The semiconductor device of claim 13, wherein the internal write signal generation circuit comprises:

a first decoded signal generation circuit configured to decode the first internal control signal based on the first internal chip selection signal to generate a first decoded signal;

a second decoded signal generation circuit configured to decode the second internal control signal based on the second internal chip selection signal to generate a second decoded signal;

a first mode write signal generation circuit configured to generate a first mode write signal from the first decoded signal based on the input mode signal; and a second mode write signal generation circuit configured to generate a second mode write signal from the second decoded signal based on the input mode signal.

16. The semiconductor device of claim 15, wherein the internal write signal generation circuit further comprises an internal write signal output circuit configured to generate the first internal write signal and the second internal write signal from the first mode write signal and the second mode write signal based on the input mode signal and the odd mode signal.

17. The semiconductor device of claim 16, wherein the internal write signal output circuit comprises:

a selection control signal generation circuit configured to generate a selection control signal according to a logic level combination of the input mode signal and the odd mode signal; and a selection/output circuit configured to, based on the selection control signal:
output the first mode write signal as the first internal write signal and output the second mode write signal as the second internal write signal; or
output the first mode write signal as the second internal write signal and output the second mode write signal as the first internal write signal.

18. The semiconductor device of claim 13, further comprising a shift control circuit configured to generate a shift control signal and a latch selection signal for setting the pre-shift period and the shift period.

19. The semiconductor device of claim 18, wherein the shift control signal is configured to:
generate a quotient and a remainder by dividing a compensation latency by "k", wherein the compensation latency is set by a latency code and an offset code; and
generate the shift control signal having a logic level combination corresponding to the quotient and the latch selection signal having a logic level combination corresponding to the remainder; and wherein "K" is a natural number which is equal to or greater than two.

20. The semiconductor device of claim 19, wherein the latency code has a logic level combination corresponding to a write latency; and wherein the offset code is set through a write leveling operation to have a logic level combination corresponding to a compensation value for compensating for the write latency.

* * * * *